United States Patent
Yang et al.

(10) Patent No.: US 11,232,755 B2
(45) Date of Patent: Jan. 25, 2022

(54) DISPLAY SUBSTRATE AND MANUFACTURING METHOD THEREFOR, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Zhongliu Yang, Beijing (CN); Yudan Shui, Beijing (CN); Yongfu Diao, Beijing (CN); Wenkang Wang, Beijing (CN); Chenyu Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/976,191

(22) PCT Filed: Oct. 23, 2019

(86) PCT No.: PCT/CN2019/112797
§ 371 (c)(1),
(2) Date: Aug. 27, 2020

(87) PCT Pub. No.: WO2021/077334
PCT Pub. Date: Apr. 29, 2021

(65) Prior Publication Data
US 2021/0125566 A1    Apr. 29, 2021

(51) Int. Cl.
*G09G 3/3275*    (2016.01)

(52) U.S. Cl.
CPC ..... *G09G 3/3275* (2013.01); *G09G 2300/046* (2013.01); *G09G 2300/0852* (2013.01)

(58) Field of Classification Search
CPC .................................................. G09G 3/3275
(Continued)

(56) References Cited

U.S. PATENT DOCUMENTS

| 8,023,090 B2 | 9/2011 | Yoon et al. |
| 10,312,202 B2 | 6/2019 | Ye et al. |

(Continued)

FOREIGN PATENT DOCUMENTS

| CN | 101598875 A | 12/2009 |
| CN | 101779526 A | 7/2010 |

(Continued)

*Primary Examiner* — Calvin C Ma
(74) *Attorney, Agent, or Firm* — Dilworth & Barrese, LLP.; Michael J. Musella, Esq.

(57) ABSTRACT

A display substrate and a manufacturing method therefor, and a display device are provided. The display substrate includes a base substrate, a plurality of sub-pixels, a plurality of data lines, a plurality of data lead lines, at least one group of contact pads, and a first insulation layer. The base substrate includes a display region and a bonding region; the data lines are configured to provide data signals to the sub-pixels; the data lead lines are electrically connected to the data lines, respectively; the at least one group of contact pads includes a first group of contact pads and a second group of contact pads; the first insulation layer is in gaps between the contact pads and covers edges of the contact pads, and is configured to expose surfaces, away from the base substrate, of the contact pads.

19 Claims, 9 Drawing Sheets

(58) Field of Classification Search
USPC .......................................................... 345/55
See application file for complete search history.

(56) References Cited

U.S. PATENT DOCUMENTS

| | | | |
|---|---|---|---|
| 10,573,833 | B2 | 2/2020 | Chen et al. |
| 2012/0006584 | A1 | 1/2012 | Matsui et al. |
| 2012/0153814 | A1* | 6/2012 | Lee ..................... H01L 27/3276 |
| | | | 313/504 |
| 2014/0027637 | A1* | 1/2014 | Watano ..................... G01T 1/16 |
| | | | 250/336.1 |
| 2017/0062680 | A1* | 3/2017 | Yoo ......................... H01L 33/32 |
| 2019/0258343 | A1* | 8/2019 | Hwang ................. G06F 3/0446 |

FOREIGN PATENT DOCUMENTS

| | | |
|---|---|---|
| CN | 101988994 A | 3/2011 |
| CN | 107706156 A | 2/2018 |
| CN | 107887339 A | 4/2018 |
| KR | 20140028461 A | 3/2014 |

\* cited by examiner

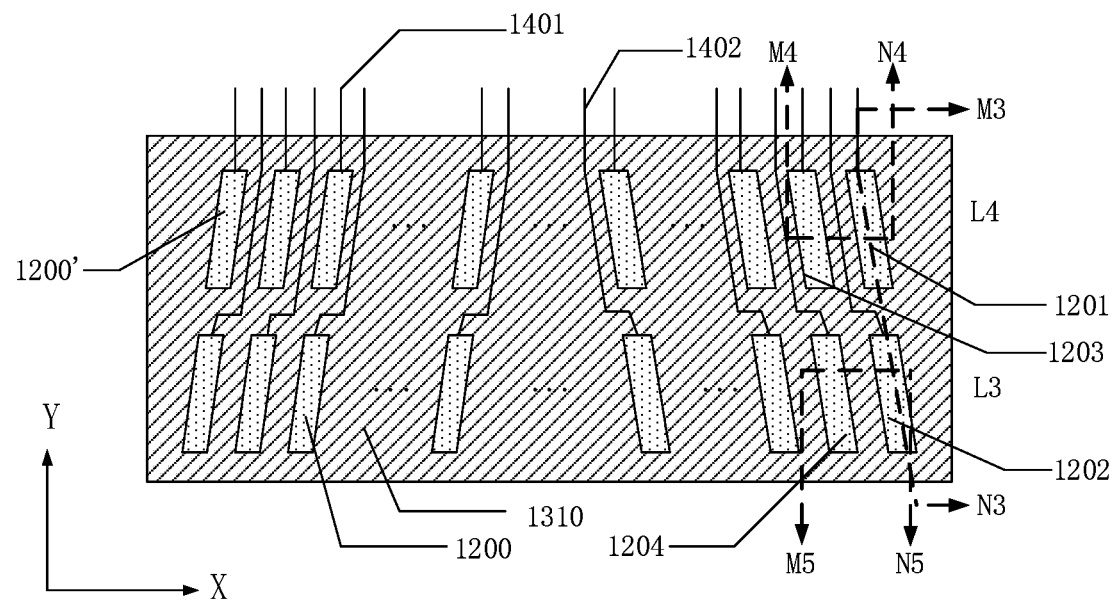
FIG. 5B(1)
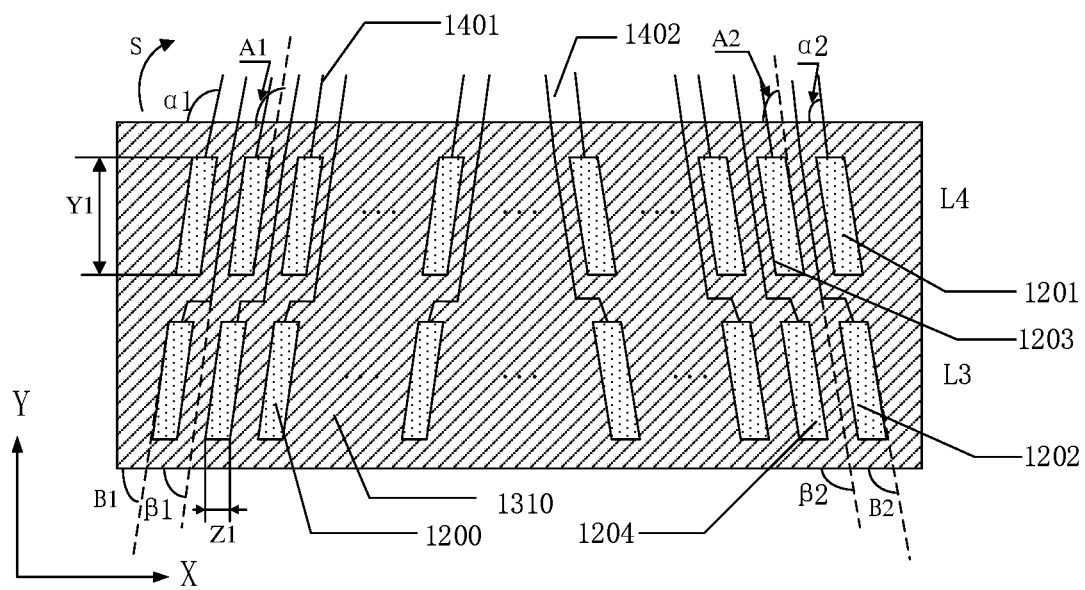
FIG. 5B(2)

DISPLAY SUBSTRATE AND MANUFACTURING METHOD THEREFOR, AND DISPLAY DEVICE

TECHNICAL FIELD

Embodiments of the present disclosure relate to a display substrate and a manufacturing method therefor, and a display device.

BACKGROUND

With the development and progress of society, the application of electronic display products is more and more extensive, and users have higher requirements for the quality of the electronic display products. The electronic display product includes a display substrate. After completing the manufacture of the display substrate, it is necessary to perform a bonding process on the display substrate, so that the display substrate is connected with an external circuit signal.

SUMMARY

At lease one embodiment of the present disclosure provides a display substrate, and the display substrate comprises: a base substrate, comprising a display region and a bonding region on at least one side of the display region; a plurality of sub-pixels, in the display region; a plurality of data lines, in the display region and configured to provide data signals to the plurality of sub-pixels; a plurality of data lead lines, in the bonding region and electrically connected with the plurality of data lines, respectively; at least one group of contact pads, in the bonding region, where the at least one group of contact pads comprises a first group of contact pads and a second group of contact pads, each of the first group of contact pads and the second group of contact pads comprises a plurality of contact pads, the second group of contact pads is on a side of the first group of contact pads away from the display region, and the plurality of data lead lines are electrically connected with the first group of contact pads and the second group of contact pads; and a first insulation layer, in the bonding region, where the first insulation layer is in gaps between the plurality of contact pads and covers edges of the plurality of contact pads, and is configured to expose surfaces, away from the base substrate, of the plurality of contact pads.

For example, in the display substrate of the above embodiment, a vertical distance between a surface, away from the base substrate, of the first insulation layer and the base substrate is not less than a vertical distance between the surfaces, away from the base substrate, of the plurality of contact pads and the base substrate.

For example, in the display substrate of the above embodiment, at least a part of the first insulation layer is in a gap between adjacent contact pads of the first group of contact pads.

For example, in the display substrate of the above embodiment, at least a part of the first insulation layer is in a gap between adjacent contact pads of the second group of contact pads.

For example, in the display substrate of the above embodiment, at least a part of the first insulation layer is in a gap between adjacent contact pads of the first group of contact pads and in a gap between adjacent contact pads of the second group of contact pads.

For example, in the display substrate of the above embodiment, a plurality of contact pads of the first group of contact pads are arranged in at least a first row, and a plurality of contact pads of the second group of contact pads are arranged in at least a second row, a row direction of the first row and a row direction of the second row are parallel to an extending direction of a side edge, facing the bonding region, of the display region, and at least a part of the first insulation layer is in a gap between the first row and the second row.

For example, in the display substrate of the above embodiment, each of a plurality of openings in the first insulation layer has a side wall, and the side wall of at least one of the plurality of openings has a slope angle relative to the base substrate, and a value range of the slope angle is from 40 degrees to 60 degrees.

For example, in the display substrate of the above embodiment, at least one of the plurality of contact pads has a length ranging from 650 microns to 750 microns and a width ranging from 34 microns to 42 microns.

For example, in the display substrate of the above embodiment, at least one of the plurality of sub-pixels comprises a thin film transistor, a planarization layer, and a light-emitting element, the planarization layer is on a side of the thin film transistor away from the base substrate to cover the thin film transistor, the light-emitting element is on a side of the planarization layer away from the base substrate, the planarization layer comprises a first planarization layer via, the thin film transistor comprises an active layer on the base substrate, a gate electrode on a side of the active layer away from the base substrate, and a source electrode and a drain electrode on a side of the gate electrode away from the base substrate, and one of the source electrode and the drain electrode is electrically connected with the light-emitting element through the first planarization layer via; and the first insulation layer and the planarization layer are arranged in a same layer.

For example, in the display substrate of the above embodiment, relative to the base substrate, a thickness of the first insulation layer in the bonding region is smaller than a thickness of the planarization layer in the display region.

For example, in the display substrate of the above embodiment, each of the plurality of contact pads comprises at least one metal layer, the at least one metal layer comprises a first metal layer, and the first metal layer, the source electrode, and the drain electrode are arranged in a same layer.

For example, in the display substrate of the above embodiment, the plurality of data lead lines comprise a first group of data lead lines and a second group of data lead lines, the first group of data lead lines is electrically connected with the first group of contact pads in one-to-one correspondence manner, the second group of data lead lines is electrically connected with the second group of contact pads in one-to-one correspondence manner, and relative to the base substrate, the first group of data lead lines and the second group of data lead lines are in different layers, respectively.

For example, in the display substrate of the above embodiment, the at least one of the plurality of sub-pixels further comprises a storage capacitor, and the storage capacitor comprises two capacitor electrodes, the first group of data lead lines and the gate electrode are arranged in a same layer, and the second group of data lead lines and one of the two capacitor electrodes of the storage capacitor are arranged in a same layer; or the second group of data lead lines and the gate electrode are arranged in a same layer, and the first group of data lead lines and one of the two capacitor electrodes of the storage capacitor are arranged in a same layer.

For example, the display substrate of the above embodiment further comprises: a bonding region interlayer insulation layer, in the bonding region, and between the plurality of contact pads and the plurality of data lead lines and between the first insulation layer and the base substrate; a bonding region first gate insulation layer, in the bonding region, and at a side of the bonding region interlayer insulation layer close to the base substrate; and a bonding region second gate insulation layer, in the bonding region, and between the bonding region first gate insulation layer and the bonding region interlayer insulation layer, and laminated with the bonding region interlayer insulation layer, the first group of contact pads is electrically connected with the first group of data lead lines in one-to-one correspondence manner through a plurality of first contact pad vias passing through the bonding region interlayer insulation layer, and the second group of contact pads is electrically connected with the second group of data lead lines in one-to-one correspondence manner through a plurality of second contact pad vias passing through the bonding region interlayer insulation layer and the bonding region second gate insulation layer; or the second group of contact pads is electrically connected with the second group of data lead lines in one-to-one correspondence manner through a plurality of second contact pad vias passing through the bonding region interlayer insulation layer, and the first group of contact pads is electrically connected with the first group of data lead lines in one-to-one correspondence manner through a plurality of first contact pad vias passing through the bonding region interlayer insulation layer and the bonding region second gate insulation layer.

For example, in the display substrate of the above embodiment, the at least one of the plurality of sub-pixels further comprises a display region interlayer insulation layer, a display region first gate insulation layer, and a display region second gate insulation layer, the display region interlayer insulation layer and the bonding region interlayer insulation layer are arranged in a same layer, the display region first gate insulation layer and the bonding region first gate insulation layer are arranged in a same layer, the display region second gate insulation layer and the bonding region second gate insulation layer are arranged in a same layer; the display region interlayer insulation layer is between the gate electrode and the source electrode as well as the drain electrode, the display region first gate insulation layer is on a side, close to the base substrate, of the display region interlayer insulation layer, and the display region second gate insulation layer is between the display region interlayer insulation layer and the display region first gate insulation layer; and the two capacitor electrodes comprise a first capacitor electrode and a second capacitor electrode, the first capacitor electrode and the gate electrode are arranged in a same layer, and the second capacitor electrode is between the display region interlayer insulation layer and the display region second gate insulation layer.

For example, in the display substrate of the above embodiment, the first group of data lead lines is provided in a same layer as the first capacitor electrode and the gate electrode, and the second group of data lead lines is provided in a same layer as the second capacitor electrode, or the second group of data lead lines is provided in a same layer as the first capacitor electrode and the gate electrode, and the first group of data lead lines is provided in a same layer as the second capacitor electrode.

For example, in the display substrate of the above embodiment, a surface, located in a gap between adjacent contact pads of the first group of contact pads and in a gap between adjacent contact pads of the second group of contact pads, of the first insulation layer has a concave portion, or a surface, located in the gap between the first row and the second row, of the first insulation layer has a concave portion.

For example, in the display substrate of the above embodiment, a part, passing through the first group of contact pads, of a data lead line electrically connected with at least one contact pad of the second group of contact pads is in a gap between adjacent contact pads of the first group of contact pads and is covered by the first insulation layer.

For example, in the display substrate of the above embodiment, at least one data lead line in the first group of data lead lines extends obliquely relative to an edge of the display substrate, or at least one data lead line in the second group of data lead lines extends obliquely relative to the edge of the display substrate.

For example, in the display substrate of the above embodiment, at least two data lead lines in the first group of data lead lines extend obliquely relative to the edge of the display substrate, and included angles of the at least two data lead lines in the first group of data lead lines relative to the edge of the display substrate in a same rotation direction are identical or complementary.

For example, in the display substrate of the above embodiment, at least two data lead lines in the second group of data lead lines extend obliquely relative to the edge of the display substrate, and included angles of the at least two data lead lines in the second group of data lead lines relative to the edge of the display substrate in a same rotation direction are identical or complementary.

For example, in the display substrate of the above embodiment, at least one contact pad of the first group of contact pads extends obliquely relative to an edge of the display substrate, or at least one contact pad of the second group of contact pads extends obliquely relative to the edge of the display substrate.

For example, in the display substrate of the above embodiment, at least two contact pads of the first group of contact pads extend obliquely relative to the edge of the display substrate, and included angles of the at least two contact pads of the first group of contact pads relative to the edge of the display substrate in a same rotation direction are identical or complementary.

For example, in the display substrate of the above embodiment, at least two contact pads of the second group of contact pads extend obliquely relative to the edge of the display substrate, and included angles of the at least two contact pads of the second group of contact pads relative to the edge of the display substrate in a same rotation direction are identical or complementary.

Another embodiment of the present disclosure provides a display device comprising the display substrate described in any embodiment of the above embodiments.

Another embodiment of the present disclosure provides a manufacturing method for a display substrate, and the manufacturing method comprises: providing a base substrate, where the base substrate comprises a display region and a bonding region on at least one side of the display region; forming a plurality of sub-pixels and a plurality of data lines in the display region, where the plurality of data lines are configured to provide data signals to the plurality of sub-pixels; forming a plurality of data lead lines in the bonding region; forming at least one group of contact pads in the bonding region, where the at least one group of contact pads comprises a first group of contact pads and a second group of contact pads, each of the first group of contact pads and the second group of contact pads comprises a plurality of contact pads, the second group of contact pads is on a side of the first group of contact pads away from the display region, and the plurality of data lead lines are electrically connected with the first group of contact pads and the second group of contact pads in one-to-one correspondence manner; and forming a first insulation layer in the bonding region, where the first insulation layer is in gaps between the plurality of contact pads and covers edges of the plurality of contact pads, and is configured to expose surfaces, away from the base substrate, of the plurality of contact pads.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

FIG. 5B(1) and FIG. 5B(2) are planar views of the bonding region of the display substrate as shown in FIG. 5A;

DETAILED DESCRIPTION

Figure 1A:
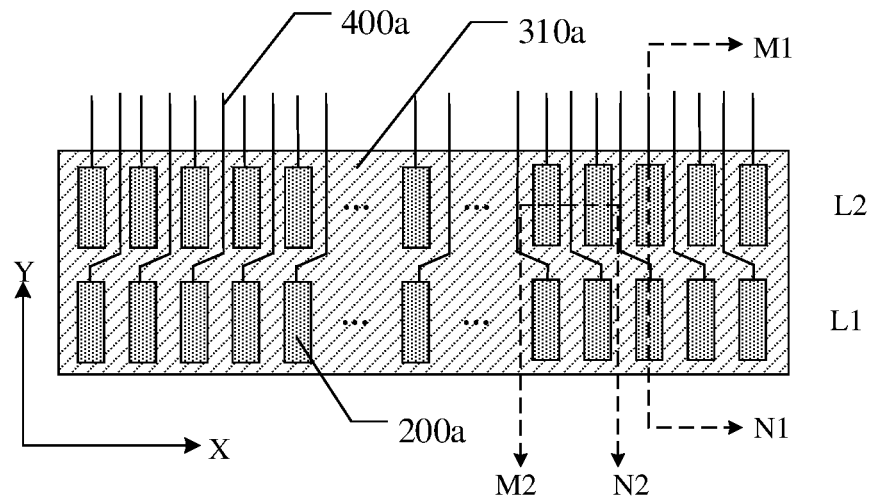
FIG. 1A is a planar view of a bonding region of a display substrate provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Generally, after a manufacturing process of a display substrate is completed, the display substrate needs to be connected with an external circuit (such as a control chip and other circuits) to control or drive the display substrate through the external circuit during a display process. For example, the external circuit may include a flexible printed circuit (Chip On Film, COF) board, and the flexible printed circuit board is provided with a control chip or a drive chip. A plurality of contact pads are arranged on the display substrate and are connected with the circuit on the flexible printed circuit board by a bonding process. If there is a step difference between the contact pad of the display substrate and a peripheral region of the display substrate, that is, the height of the contact pad is greater than the height of the peripheral region, in the bonding process, the force applied by a force head of the device for providing force on the base substrate is unevenly distributed. For example, the force is concentrated on the plurality of contact pads and is difficult to apply to gap regions among the plurality of contact pads. The display substrate may break due to uneven distributed pressure. For example, film layers in the gaps among the plurality of contact pads will break under the action of tensile stress caused by the uneven distributed pressure, thereby damaging the display substrate.

For example, in the manufacturing process of a display substrate, a film layer (such as an insulation layer) included in the display substrate is formed by a physical vapor deposition or a chemical vapor deposition (such as plasma enhanced chemical vapor deposition (PECVD)), and crystals in the film layer usually have defects in microstructure. In an actual manufacturing process, in a case where there is a step difference between the plurality of contact pads and the peripheral region, applying a force to the plurality of contact pads will cause uneven stress in the bonding region and cause a phenomenon of stress concentration. For example, the stress is concentrated in a region where a tip part(for example, a corner) of the plurality of contact pads is located, which will aggravate the crystal defects in the film layer, and further make the film layer easy to break.

For example, in the actual manufacturing process, through detecting and performing mechanical simulation analysis on the display substrate, at a part of the film layer in the region between the two contact pads, during a bonding process, a positive tensile stress and a reverse tensile stress applied to the two contact pads along the region between the two contact pads will be generated, which will cause the film layer in this part to break due to tension. For example, in a case where the gap between the two contact pads ranges from 50 mm to 100 mm, the tensile stress generated by a part of the film layer formed by silicon nitride located in the gap between two contact pads is approximately 182 MPa-712 MPa.

Embodiments of the present disclosure provide a display substrate and a manufacturing method therefor, and a display device. The display substrate includes: a base substrate, a plurality of sub-pixels, a plurality of data lines, a plurality of data lead lines, at least one group of contact pads, and a first insulation layer. The base substrate includes a display region and a bonding region located on at least one side of the display region; the plurality of sub-pixels are located in the display region; the plurality of data lines are located in the display region and are configured to provide data signals to the plurality of sub-pixels; the plurality of data lead lines are located in the bonding region and are electrically connected with the plurality of data lines, respectively; the at least one group of contact pads is located in the bonding region, the at least one group of contact pads includes a first group of contact pads and a second group of contact pads, each of the first group of contact pads and the second group of contact pads includes a plurality of contact pads, the second group of contact pads is located on a side of the first group of contact pads away from the display region, and the plurality of data lead lines are electrically connected with the first group of contact pads and the second group of contact pads, respectively; the first insulation layer is located in the bonding region, the first insulation layer is located in gaps between the plurality of contact pads and covers edges of the plurality of contact pads, and is configured to expose surfaces, away from the base substrate, of the plurality of contact pads.

For example, in at least one embodiment of the present disclosure, the gaps between the plurality of contact pads cover the edges of the plurality of contact pads and are configured to expose the surfaces, away from the base substrate, of the plurality of contact pads. In this way, the first insulation layer in the gaps between the plurality of contact pads can reduce or eliminate a step difference between the contact pad and the gap between the contact pad, so that in a bonding process, the force applied by a force head on the surface of the first insulation layer and surfaces of the plurality of contact pads is dispersed and is distributed more evenly (for example, the pressure of the force is equal), that is, the force applied by the force head on the plurality of contact pads and the gaps between the plurality of contact pads is distributed more evenly. The display substrate (a bonding region of the display substrate) will not be damaged due to uneven pressure in the bonding process, which improves the yield of the display substrate in actual manufacturing and reduces the manufacturing cost.

Next, a display substrate and a manufacturing method therefor, and a display device according to at least one embodiment of the present disclosure will be described with reference to the accompanying drawings.

In each accompanying drawing of the present disclosure, a spatial rectangular coordinate system is established based on a base substrate of the display substrate to explain the position of each structure in the display substrate. In the spatial rectangular coordinate system, a X axis and a Y axis are parallel to the plane where the base substrate is located, and a Z axis is perpendicular to the plane where the base substrate is located.

At least one embodiment of the present disclosure provides a display substrate, the structure of the display substrate will be described in detail below.

For example, the display substrate includes a base substrate, a plurality of contact pads, and a first insulation layer. The base substrate includes a display region and a peripheral region at least partially surrounding the display region. The peripheral region further includes at least one bonding region (for example, a plurality of bonding regions) located on at least one side of the display region, and the plurality of contact pads are located in the bonding region and have gaps between each other, that is, the plurality of contact pads are spaced apart from each other by a certain distance.

FIG. 1A is a planar view of a bonding region of a display substrate provided by at least one embodiment of the present disclosure. As shown in FIG. 1A, the plurality of contact pads are arranged in at least two rows, and at least a part of the first insulation layer is also located in a gap between the contact pads arranged in different rows. Exemplarily, in the bonding region of the display substrate, a plurality of contact pads 200a are arranged in two rows, that is, a first row L1 and a second row L2, and a first insulation layer 310a is provided at a gap between a contact pad 200a in the first row L1 and a contact pad 200a in the second row L2. In actual process, due to the limitation of process conditions, a gap between the contact pads arranged in different rows is usually larger than a gap between contact pads in the same row. In the case where the first insulation layer is not provided, the part of the display substrate located at the gap between the contact pads arranged in different rows is more likely to break in a bonding process. In this way, the first insulation layer 310a can prevent the portion of the display substrate located in the gap between the contact pads arranged in different rows from breaking in the bonding process. In addition, more contact pads can be arranged in the bonding region. In the actual process, the plurality of contact pads can be allowed to have a larger design size, and a larger gap between two adjacent contact pads can also be allowed, thus reducing the difficulty of the manufacturing process and reducing the manufacturing cost.

For example, in at least one embodiment of the present disclosure, a vertical distance between a surface, away from the base substrate, of the first insulation layer and the base substrate is not less than a vertical distance between surfaces, away from the base substrate, of the plurality of contact pads and the base substrate.

Figure 1B:
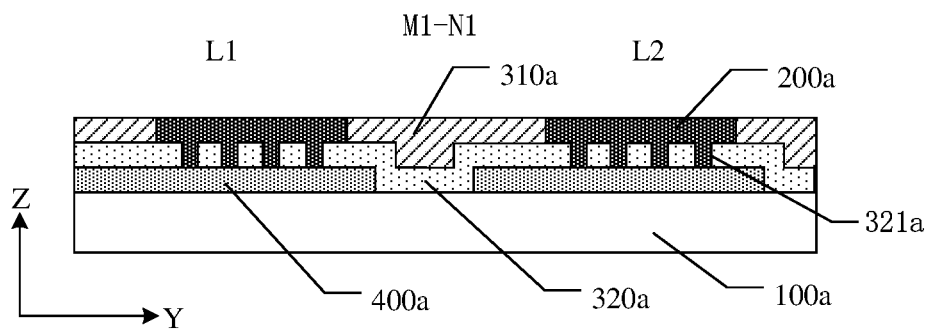
FIG. 1B is a cross-sectional view of the display substrate as shown in FIG. 1A along a line M1-N1.
Figure 1C:
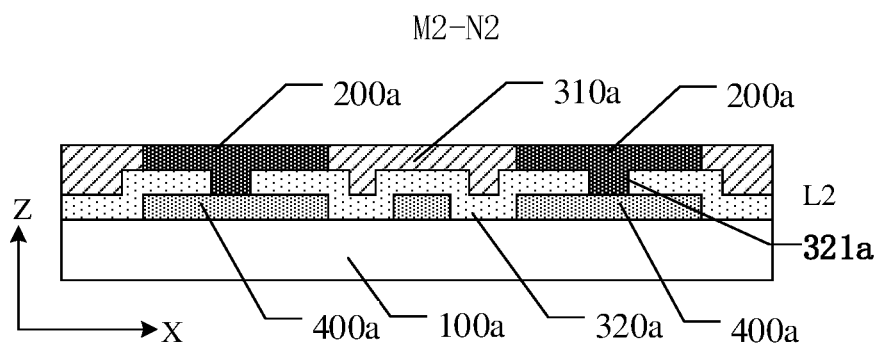
FIG. 1C is a cross-sectional view of the display substrate as shown in FIG. 1A along a line M2-N2.

In at least one example, as shown in FIG. 1B and FIG. 1C, the surface of the first insulation layer 310a away from the base substrate 100a and the surfaces of the plurality of contact pad 200a away from the base substrate 100a are basically on the same plane, that is, the height of the first insulation layer 310a relative to the base substrate 100a and the height of the plurality of contact pads 200a relative to the base substrate 100a are basically equal.

In an embodiment of the present disclosure, "height" is a vertical distance from the surface of the structure (for example, a contact pad 200a) away from the base substrate to the base substrate. It should be noted that, in the embodiments of the present disclosure, the height of the first insulation layer may be larger or smaller than the height of the contact pad, for example, slightly larger or slightly smaller than the height of the contact pad, the embodiments of the present disclosure are not limited to a case where the height of the first insulation layer is equal to the height of the contact pad as shown in FIG. 1B and FIG. 1C.

Figure 1D:
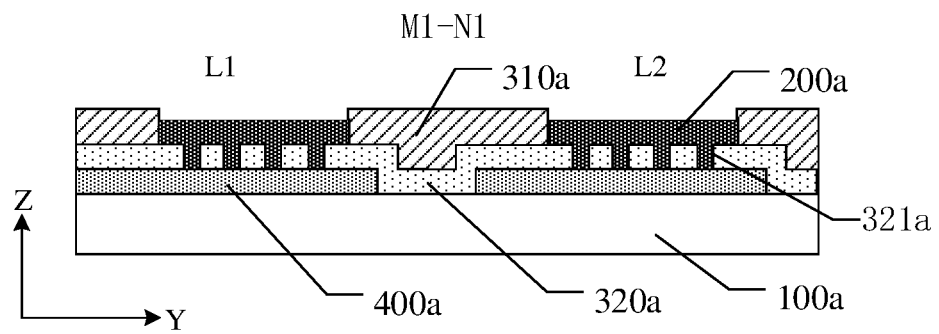
FIG. 1D is a cross-sectional view of the display substrate as shown in FIG. 1A along a line M1-N1 provided by another embodiment.

Compared with the bonding region of the display panel of the embodiment as shown in FIG. 1B, in the bonding region of the display panel as shown in FIG. 1D, the height of the first insulation layer 310a is greater than the height of the contact pad 200a. It should be noted that, "height" here is the vertical distance from the surface of the structure (for example, a contact pad 200a) away from the base substrate to the base substrate. The height of the first insulation layer 310a increases, that is, the thickness of the first insulation layer 310a increases, which can increase the structural strength of a part, located in a gap between the contact pads arranged in different rows, of the display substrate, thereby further preventing the part, located in a gap between the contact pads arranged in different rows, of the display substrate from being breaking during the bonding process.

It should be noted that in at least one embodiment of the present disclosure, the first insulation layer may not only be located in the gaps between the plurality of contact pads, as shown in FIG. 1A, except for the region where the plurality of contact pads are located and the gaps between the plurality of contact pads, the first insulation layer may also be provided to cover other regions of the bonding region, and may further cover other regions of the peripheral region. In this way, in a direction of a plane determined by X-Y, each of the plurality of contact pads can be surrounded by the first insulation layer. In the bonding process, the bonding region of the display substrate is uniformly stressed, which not only prevents the gaps between the plurality of contact pads from breaking, but also prevents other regions of the bonding region from breaking due to uneven stress.

Next, taking the first insulation layer covering all regions of the bonding region except the region where the plurality of contact pads are located as an example, a display substrate and a manufacturing method therefor, and a display device in at least one following embodiment of the present disclosure will be described.

For example, in at least one embodiment of the present disclosure, a plurality of data lead lines located in the bonding region are in one-to-one correspondence to a plurality of contact pads, and one end part of each data lead line is connected with a contact pad corresponding to the data lead line, and the other end part of each data lead line extends to the display region so as to be electrically connected with the corresponding signal line in the display region. In this way, after performing the bonding process, elements in the display region can be signal-connected with a control chip, etc., through the flexible printed circuit board.

For example, in at least one embodiment of the present disclosure, a layer where data lead lines are located is located between a layer where the contact pads are located and the base substrate. For example, for a data lead line and a contact pad, which are electrically connected with each other, an end part, which is electrically connected with the contact pad, of the data lead line overlaps with the contact pad in a direction perpendicular to the base substrate and is located between the contact pad and the base substrate.

For example, in at least one embodiment of the present disclosure, in the case where the plurality of contact pads are arranged in at least two rows, data lead lines connected with contact pads in a row away from the display region are located in gaps between contact pads in a row close to the display region. In this way, in the case where the data lead lines in the bonding region are all in the same layer, the data lead lines connected with the plurality of contact pads in different rows can be prevented from contacting each other.

Exemplarily, as shown in FIG. 1A, FIG. 1B, and FIG. 1C, a part, which is located in a second row L2, of the data lead lines 400a connected with the contact pads 200a located in a first row L1 is routed in the gaps between the contact pads 200a in the second row L2 and covered by the first insulation layer 310a, that is, the data lead lines 400a, which are connected with the contact pads 200a in the first row L1 away from the display region, passed through the gaps between the contact pads 200a in the second row L2 close to the display region and extend to the display region to be electrically connected with the signal lines in the display region.

For example, on the base substrate 100, the data lead lines and the signal lines are formed in different layers, for example, the data lead lines and the signal lines are electrically connected in one-to-one correspondence manner through one or more vias in an insulation layer sandwiched between the data lead lines and the signal lines. Alternatively, the data lead lines and the signal lines are formed in the same layer, for example, the data lead lines and the signal lines are directly electrically connected.

For example, the display substrate provided by at least one embodiment of the present disclosure further includes a second insulation layer located between the contact pads and the data lead lines, vias are provided in the second insulation layer, and each of the data lead lines is connected with a corresponding contact pad through a via.

Exemplarily, as shown in FIG. 1A, FIG. 1B, FIG. 1C, and FIG. 1D, in the bonding region, the second insulation layer 320a is located between the contact pads 200a and the data lead lines 400a, and the second insulation layer 320a covers the data lead lines 400a. The contact pads 200a are electrically connected with the data lead lines 400a through one or more vias 321a provided in the second insulation layer 320a. In the second row L2, because the second insulation layer 320a covers the data lead lines 400a connected with the contact pads in the first row L1, during forming the contact pads 200a, it is only necessary to consider that the gaps between the contact pads 200a are designed according to the requirement that the contact pads 200a can be spaced apart from each other, and in this case, the contact pads can have a larger design region. For example, in an actual process, in the second row L2, the data lead line 400a located between two contact pads 200a may partially overlap with the contact pads 200a in the second row L2.

For example, in at least one embodiment of the present disclosure, the first insulation layer, the contact pads, the second insulation layer, and the data lead lines in the bonding region may be formed together with the corresponding structural layers in the display region, thereby reducing the flow of the manufacturing process of the display substrate.

For example, in at least one embodiment of the present disclosure, in the case where the data lead lines and the contact pads are located in different layers, the data lead lines may be configured to be arranged in the same layer as one conductive layer in the display region, and the contact pads may be configured to be arranged in the same layer as other one conductive layer in the display region.

The display substrate of the above embodiment further includes a pixel structure for a sub-pixel and located in the display region. The pixel structure includes a pixel drive circuit, a planarization layer, and a light-emitting element.

The planarization layer is located on a side of the pixel drive circuit away from the base substrate to provide a planarization surface and includes a first via. The light-emitting element is located on the planarization surface and electrically connected with the pixel drive circuit through the first via, and the first insulation layer and the planarization layer are arranged in the same layer.

The pixel drive circuit includes a thin film transistor, and the thin film transistor includes an active layer, a gate insulation layer, a gate electrode, an interlayer dielectric layer, a source electrode, a drain electrode, etc. The pixel drive circuit may also include a storage capacitor, and the storage capacitor includes two capacitor electrodes opposite to each other.

Figure 2:
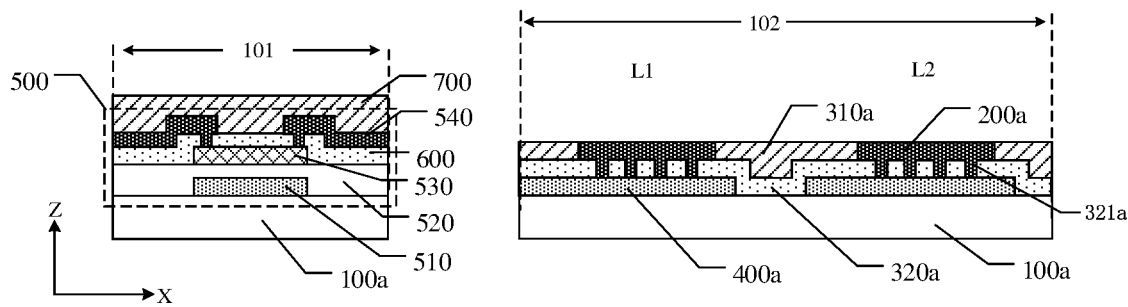
FIG. 2 is a planar view of a partial region of a display substrate provided by at least one embodiment of the present disclosure.

For example, in at least one embodiment of the present disclosure, as shown in FIG. 2, the display substrate includes a thin film transistor 500 and an interlayer dielectric layer 600 located in a sub-pixel in the display region 101. For example, the thin film transistor 500 may be a drive transistor or a light-emitting control transistor in a pixel circuit, and may include a gate electrode 510, a gate insulation layer 520, an active layer 530, and a source-drain electrode layer 540 sequentially located on the base substrate 100a. The source-drain electrode layer 540 includes a source electrode and a drain electrode of a transistor, and one of the source electrode and the drain electrode is electrically connected with the light-emitting element. The interlayer dielectric layer 600 is located between the active layer 530 and the source-drain electrode layer 540. A data lead line 400a and the gate electrode 510 are arranged in the same layer. Of course, the embodiments are not limited to the case that the thin film transistor 500 is a driving transistor or a light-emitting control transistor in a pixel circuit, the thin film transistor 500 can also be other transistors on a display substrate, such as a transistor for achieving the compensation function of the pixel circuit.

In the embodiments of the present disclosure, "arranged in the same layer" means that two structures (for example, the data lead line 400a and the gate electrode 510) are arranged in the same layer and formed by the same material, that is, the two structures are formed by the same material layer, for example, can be formed by the same material layer through a patterning process.

For example, in at least one embodiment of the present disclosure, a first conductive layer includes the source-drain electrode layer of the thin film transistor, for example, further includes data lines. A second conductive layer includes the gate electrode of the thin film transistor, for example, further includes gate lines. Exemplarily, as shown in FIG. 2, the contact pads 200a and the source-drain electrode layer 540 are arranged in the same layer, and the second insulation layer 320a and the interlayer dielectric layer 600 are arranged in the same layer.

For example, in at least one embodiment of the present disclosure, in the process of manufacturing elements in the display region, after forming the second conductive layer, an insulation material layer is deposited, and the insulation material layer can be simultaneously deposited in the bonding region to form the second insulation layer 320a as shown in FIG. 1B.

For example, in at least one embodiment of the present disclosure, the display region is provided with a planarization layer to planarize the surface of the display substrate, and the first insulation layer may be configured to be arranged in the same layer as the planarization layer.

Exemplarily, as shown in FIG. 1A, FIG. 1B, FIG. 1C, and FIG. 1D, after forming the source-drain electrode layer 540 and the contact pads 200a, an insulation material (for example, a first material layer in the following embodiment) may be deposited to planarize the surface of the display substrate. The part of the insulation material in the display region 101 is formed as the planarization layer 700, and the part of the insulation material in the bonding region 102 is formed as the first insulation layer 310a.

For example, in at least one embodiment of the present disclosure, the data lead lines in the bonding region may be data lead lines configured for gate lines, data lines, or other types of signal lines, for example, the other types of signal lines and the data lines are electrically connected with the data lead lines.

For example, in at least one embodiment of the present disclosure, the thin film transistor in the display substrate may be a bottom gate thin film transistor as shown in FIG. 2, or may be provided as a top gate thin film transistor, a double gate thin film transistor, or other types of thin film transistors. For example, in the case where the thin film transistor 500 shown in FIG. 2 is a bottom gate thin film transistor, the second insulation layer 320a may also be arranged in the same layer as the gate insulation layer 520, and accordingly, an insulation layer that is arranged in the same layer as the interlayer dielectric layer 600 may or may not be arranged in the bonding region.

In at least one embodiment of the present disclosure, the thickness of the contact pad, the thickness of the data lead line, and the thickness of the second insulation layer are not limited, but can be designed according to specific processes, and the thickness of the first insulation layer can be designed according to the thickness of the contact pad, the thickness of the data lead line, and the thickness of the second insulation layer. For example, in the bonding region shown in FIG. 2, the thickness of the data lead line 400a may be 2000 angstroms to 3000 angstroms, for example, 2300 angstroms, 2500 angstroms, 2700 angstroms, etc. The thickness of the second insulation layer 320a may be 4000 angstroms to 6000 angstroms, for example, 5000 angstroms. The thickness of the contact pad 200a may be 6000 angstroms to 7000 angstroms, for example, 6300 angstroms, 6500 angstroms, 6700 angstroms, etc. It should be noted that, in the embodiments of the present disclosure, the "thickness" may be a distance from a surface of a structure (for example, a contact pad) away from the base substrate to a surface facing the base substrate.

Figure 3:
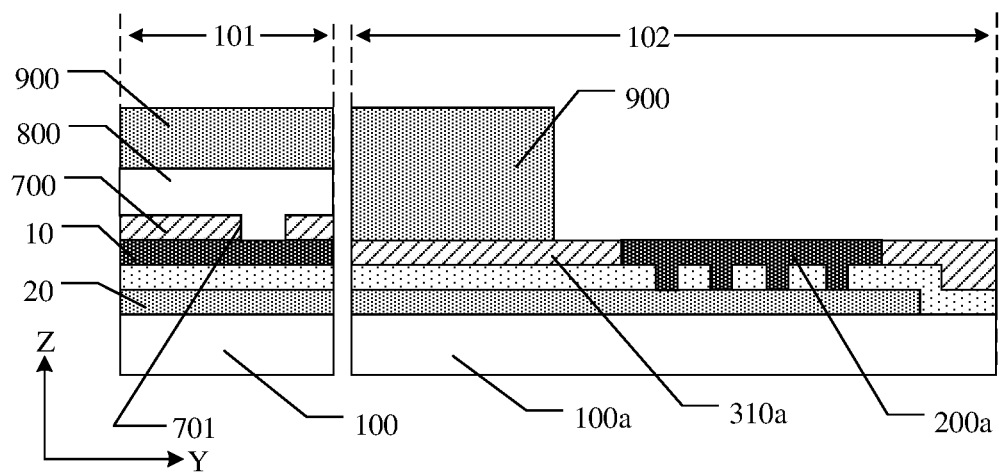
FIG. 3 is a cross-sectional view of a display substrate provided by at least one embodiment of the present disclosure.

For example, in at least one embodiment of the present disclosure, as shown in FIG. 3, the display region 101 of the display substrate is provided with a light-emitting structure layer 800, and the light-emitting structure layer 800 is located on a side of the planarization layer 700 away from the base substrate 100. The light-emitting structure layer 800 may include a plurality of light-emitting elements corresponding to a plurality of sub-pixels arranged in an array, and each of the plurality of light-emitting elements may be, for example, an organic light-emitting diode (OLED) or a quantum dot light-emitting diode (QLED), and may include a first electrode, a second electrode, and a light-emitting layer located between the first electrode and the second electrode. A via 701 may be arranged in the planarization layer 700, and one of the first electrode and the second electrode is connected with the first conductive layer (for example, a drain electrode of the thin film transistor) in the pixel structure through the via 701. For example, the first electrode is an anode, and the second electrode is a cathode.

For example, for OLED, the light-emitting layer may adopt a small molecular organic material or a polymer molecular organic material, which may be a fluorescent light-emitting material or a phosphorescent light-emitting material, and may emit red light, green light, blue light, or white light. In addition, the light-emitting layer may further include functional layers such as an electron injection layer, an electron transport layer, a hole injection layer, a hole transport layer, and the like as required. For QLED, the light-emitting layer may adopt a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dot is 2~20 nm.

For example, in at least one embodiment of the present disclosure, as shown in FIG. 3, the display substrate further includes an encapsulation layer 900 covering the light-emitting structure layer 800, the encapsulation layer 900 can extend to the bonding region, and the encapsulation layer 900 does not cover the contact pads 200a.

For example, the encapsulation layer 900 may have a single layer structure or a composite structure of at least two layers. For example, the material of the encapsulation layer may include insulation materials such as silicon nitride, silicon oxide, silicon oxynitride, polymer resin, etc. For example, the encapsulation layer may include a first inorganic encapsulation layer, an organic encapsulation layer, and a second inorganic encapsulation layer sequentially arranged on the light-emitting structure layer. For example, the materials of the first inorganic encapsulation layer and the second inorganic encapsulation layer may include inorganic materials such as silicon nitride, silicon oxide, and silicon oxynitride, and the inorganic materials have high compactness and can prevent invasion of water, oxygen, etc. The material of the organic encapsulation layer may be a polymer material containing a desiccant or a polymer material configured to block water vapor, such as a polymer resin or the like, to planarize the surface of the display substrate, and to relieve the stress of the first inorganic encapsulation layer and the second inorganic encapsulation layer. The material of the organic encapsulation layer may further include a water absorbent material such as a desiccant to absorb substances such as water and oxygen that have penetrated into the interior of the display substrate.

At least one embodiment of the present disclosure provides a display device, and the display device may include the display substrate according to any one of the above embodiments.

Figure 4:
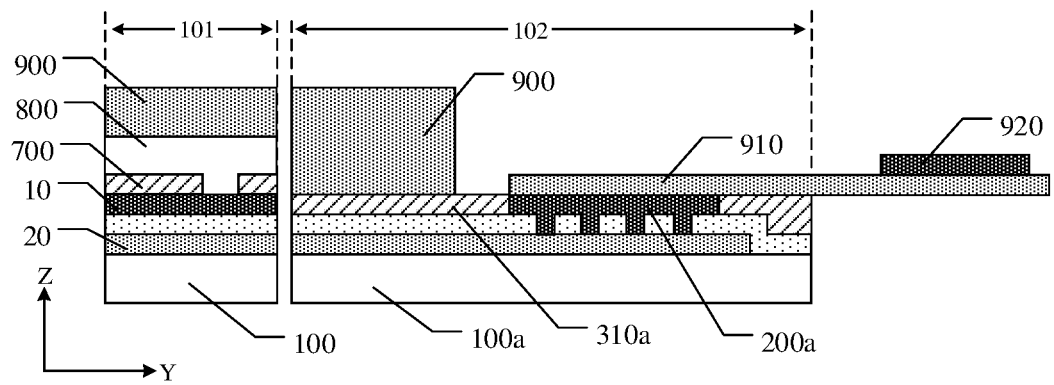
FIG. 4 is a cross-sectional view of a display device provided by at least one embodiment of the present disclosure.

For example, in at least one embodiment of the present disclosure, as shown in FIG. 4, the display device includes a flexible printed circuit board 910, a control chip 920 is arranged on the flexible printed circuit board 910, and the flexible printed circuit board 910 is electrically connected with the contact pads 200a.

For example, the control chip may be a central processing unit, a digital signal processor, a system chip (SoC), etc. For example, the control chip may also include a memory, a power supply module, etc., and a function of supplying power and a function of inputting and outputting signals are achieved through additionally arranged wires, signal lines, etc. For example, the control chip may further include a hardware circuit, computer executable codes, etc. The hardware circuit may include conventional very large scale integration (VLSI) circuits or gate arrays, and existing semiconductors such as logic chips, transistors, or other discrete components. The hardware circuit may further include field programmable gate arrays, programmable array logic, programmable logic devices, etc.

For example, the display device provided by at least one embodiment of the present disclosure may be any product or component having a display function such as a mobile phone, a tablet computer, a television, a display, a notebook computer, a digital photo frame, a navigator, etc.

Figure 5A:
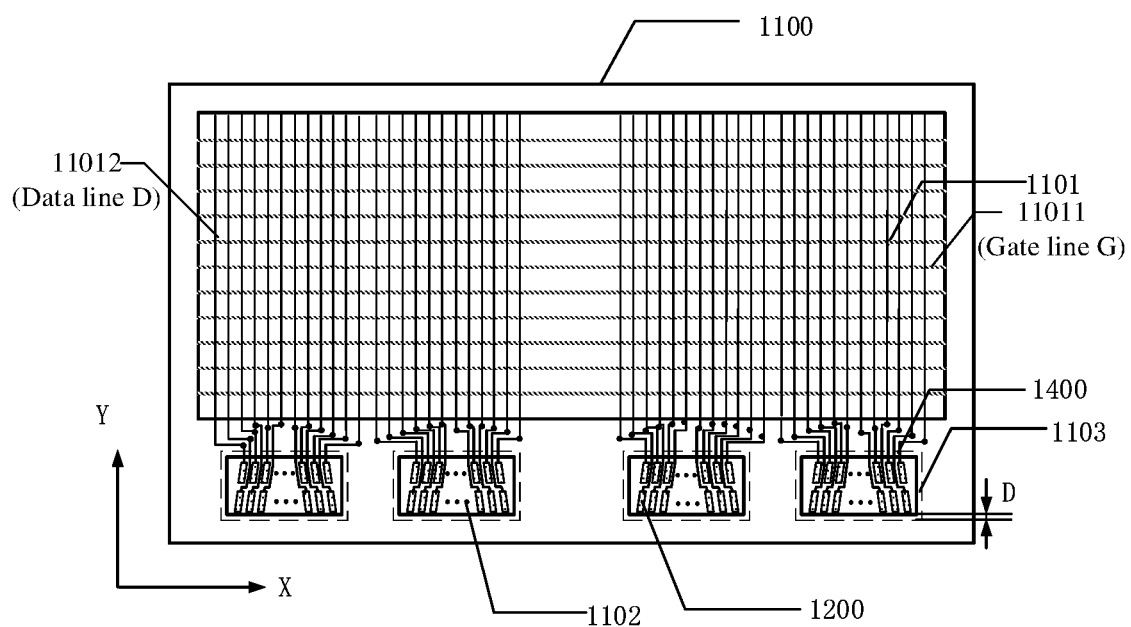
FIG. 5A is a planar view of a display substrate provided by at least one embodiment of the present disclosure.

At least one embodiment of the present disclosure also provides another display substrate, as shown in FIG. 5A, FIG. 5B(1), and FIG. 5B(2), the display substrate includes a base substrate, the base substrate includes a display region 1101 and a peripheral region 1103 at least partially surrounding the display region 1101, and the peripheral region 1103 further includes at least one bonding region 1102 (for example, four bonding regions are shown in the figure) located on at least one side of the display region 1101. A plurality of contact pads 1200 are located in each bonding region 1102 and have gaps with each other, that is, the plurality of contact pads 1200 are spaced apart from each other by a certain distance.

In this embodiment, the display region 1101 includes a plurality of sub-pixels, a plurality of signal lines 11011 (for example, gate lines G) extending along a first direction (X axis direction in the figure), and a plurality of signal lines 11012 (for example, data lines D) extending along a second direction (Y axis direction in the figure). The display substrate includes a plurality of data lead lines 1400 located in the bonding region 1102. These signal lines extend or are routed to the bonding region located on at least one side of the display region 1101. For example, the signal lines 11012 are electrically connected with the corresponding data lead lines, therefore, the signal lines can be electrically connected with drive chips, flexible printed circuit board, etc. in the bonding region.

As the resolution of the pixel array of the display substrate increases, the traces, which are configured for the signal lines in the display region, in the peripheral region of the display substrate become more and more dense. Therefore, in this embodiment, in order to avoid mutual interference or short circuit between adjacent lead lines in the peripheral region of the display substrate, traces for adjacent lead lines of the same type (such as data lead lines) may be arranged on different conductive layers at the peripheral region of the display region.

In at least one embodiment of the present disclosure, the display substrate includes a plurality of lead lines electrically connected with a plurality of contact pads in one-to-one correspondence manner, and one end part of each of the plurality of lead lines is electrically connected with a corresponding one contact pad of the plurality of contact pads, and the other end part of each of the plurality of lead lines extends toward the display region, thereby being electrically connected with a corresponding signal line in the display region. These lead lines and the corresponding signal lines can be located in the same layer, so as to be directly electrically connected, or can be located in different layers, so that these lead lines and the corresponding signal lines are electrically connected in one-to-one correspondence manner through one or more vias in an insulation layer sandwiched between these lead lines and the corresponding signal lines.

In the display substrate of this embodiment, for example, the plurality of contact pads are s, and at least a part of the first insulation layer is located in gaps between a plurality of contact pads in one row, at least a part of the first insulation layer is located in gaps between contact pads in different rows, or at least a part of the first insulation layer is simultaneously located in the gaps between a plurality of contact pads in one row and in the gaps between contact pads in different rows. In addition, the display substrate also includes a plurality of insulation layers, the plurality of insulation layers are respectively located between different conductive layers in a direction perpendicular to the base substrate so as to separate the conductive layers from each other.

In this embodiment, in the examples as shown in FIG. 5A, FIG. 5B(1), and FIG. 5B(2), in at least one bonding region of the display substrate, contact pads 1200 are arranged in two rows, which are named as a second group of contact pads 1200 in the first row L3 and a first group of contact pads 1200' in the second row L4. A first insulation layer 1310 is disposed at the gaps between the contact pads in the second group of contact pads 1200 in the first row L3, or disposed at the gaps between the contact pads in the first group of contact pads 1200' in the second row L4, or disposed at the gaps between the contact pads in the second group of contact pads 1200 in the first row L3 and the gaps between the contact pads in the first group of contact pads 1200' in the second row L4, or disposed at all of the gaps mentioned above. In an actual process, due to the limitation of process conditions, the gap between the two contact pads in different rows is usually larger than the gap between two contact pads in the same row. In a case where the first insulation layer 1310 is not provided, a part of the display substrate located at the gap between the contact pads in different rows is more likely to be broken in the bonding process. The arrangement of the first insulation layer 1310 makes the part of the display substrate located at the gap between the contact pads in different rows less likely to be broken in the bonding process, which improves the yield and reduces the cost.

In the examples as shown in FIG. 5A, FIG. 5B(1), and FIG. 5B(2), a plurality of data lead lines electrically connected with the data lines D will be described. The plurality of data lead lines includes a first group of data lead lines and a second group of data lead lines, data lead lines of the first group of data lead lines are electrically connected with contact pads of the first group of contact pads in one-to-one correspondence manner, data lead lines of the second group of data lead lines are electrically connected with contact pads of the second group of contact pads in one-to-one correspondence manner, and relative to the base substrate, the first group of data lead lines and the second group of data lead lines are respectively located in different layers.

Figure 5C:
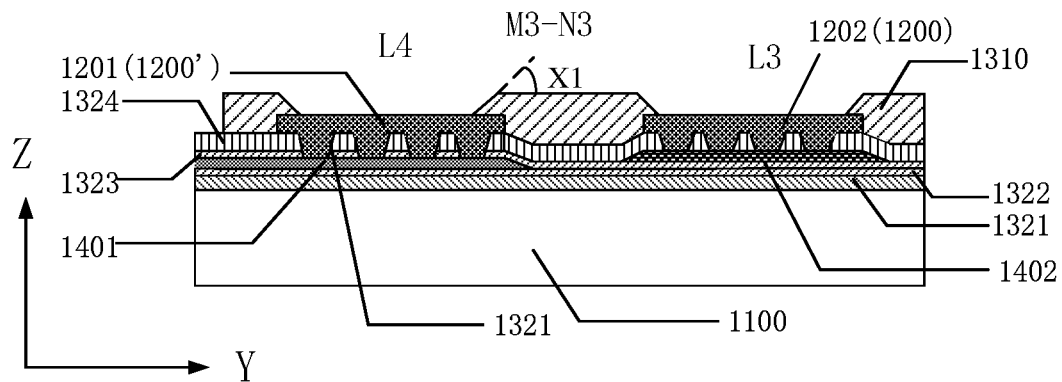
FIG. 5C is a cross-sectional view of the display substrate as shown in FIG. 5A along a line M3-N3.

FIG. 5C is a cross-sectional view of the display substrate as shown in FIG. 5A along the line M3-N3. As shown in FIG. 5C, in FIG. 5B, a contact pad 1201 and a contact pad 1203 located in the second row L4, and a contact pad 1202 and a contact pad 1204 located in the first row L3 are located in the same layer. However, the first group of data lead lines electrically connected with the first group of contact pads and the second group of data lead lines electrically connected with the second group of contact pads are located in different layers, respectively.

Specifically, in the example in the figure, the plurality of data lead lines 1400 include a first group of data lead lines 1401 and a second group of data lead lines 1402. The first group of data lead lines 1401 is disposed between a first gate insulation layer 1322 (that is, a bonding region first gate insulation layer) and a second gate insulation layer 1323 (that is, a bonding region second gate insulation layer), and an end part of one data lead line of the first group of data lead lines 1401 in the bonding region is electrically connected with the contact pad 1201 through one via or more vias passing through the second gate insulation layer 1323 and an interlayer insulation layer 1324 (a bonding region interlayer insulation layer). The second group of data lead lines 1402 is disposed between the second gate insulation layer 1323 and the interlayer insulation layer 1324, and an end part of one data lead line of the second group of data lead lines 1402 in the bonding region is electrically connected with the contact pad 1202 through one via or more vias in the interlayer insulation layer 1324. A buffer layer 1321 is arranged between the first gate insulation layer 1322 and the base substrate 1100. In the direction perpendicular to the base substrate 1100, the first group of data lead lines 1401 and the second group of data lead lines 1402 are arranged in different layer, so that the distance between adjacent data lead lines in the same layer can be made larger, thereby reducing or avoiding the interference between data lead lines in the same layer during arranging the data lead lines.

Figure 5D:
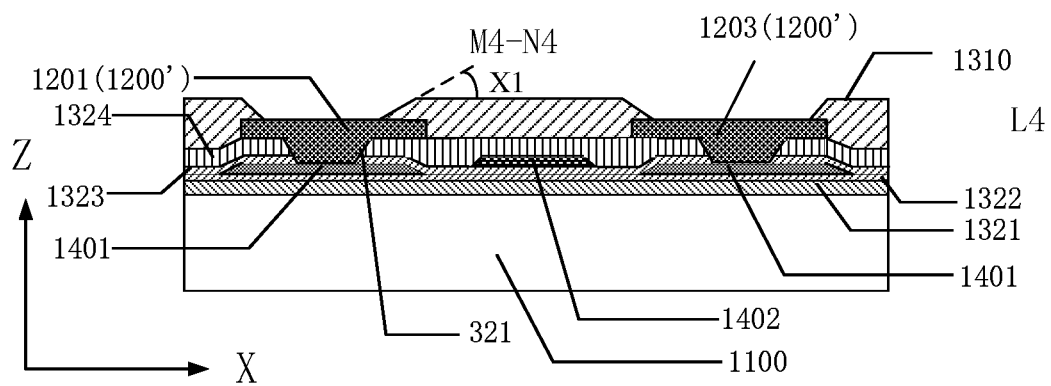
FIG. 5D is a cross-sectional view of the display substrate as shown in FIG. 5B(1) along a line M4-N4.

In this embodiment, FIG. 5D is a cross-sectional view of the display substrate as shown in FIG. 5B(1) along the line M4-N4 at the second row L4. As shown in FIG. 5D, a contact pad 1201 and a contact pad 1203 in the second row L4 in FIG. 5B(1) are located in the same layer. The contact pad 1201 and the contact pad 1203 on the second row L4 are electrically connected with two data lead lines of the first group of data lead lines 1401, respectively. In addition, one end of the second group of data lead lines 1402 located on a different layer from the first group of data lead lines 1401 extends to the display region from the gap between the contact pad 1201 and the contact pad 1203 in the second row L4 close to the display region 1101 and is electrically connected with the data line D, and the other end of the second group of data lead lines 1402 is electrically connected with the second group of contact pads 1200 through one via or more vias passing through the interlayer insulation layer 1324. Therefore, the above arrangement can avoid mutual interference or short circuit between adjacent data lead lines.

Figure 5E:
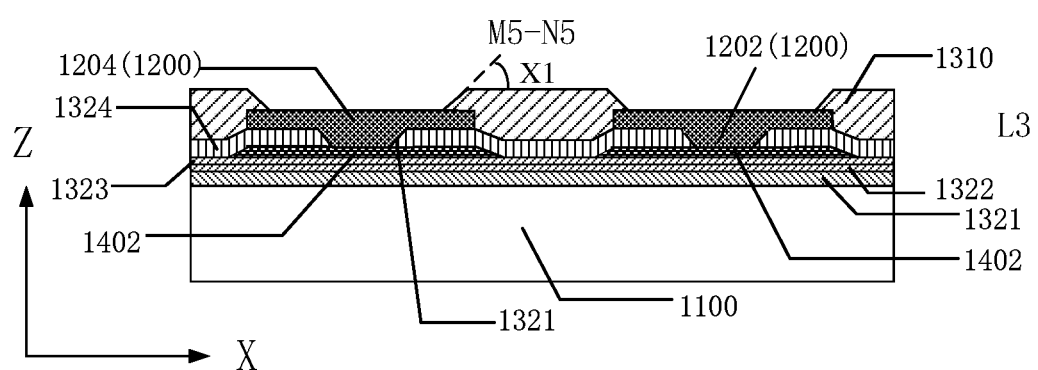
FIG. 5E is a cross-sectional view of the display substrate as shown in FIG. 5B(2) along a line M5-N5.

In this embodiment, FIG. 5E is a cross-sectional view of the display substrate as shown in FIG. 5B(2) along the line M5-N5 at the first row L3. As shown in FIG. 5E, the contact pad 1202 and the contact pad 1204 in the first row L3 in FIG. 5B(1) are located in the same layer. The contact pad 1202 and the contact pad 1204 in the first row L3 are electrically connected with two data lead lines of the second group of data lead lines 1402, respectively. The first group of data lead lines 1401 is not arranged on the second row L3, so that the contact pads have a larger arrangement space.

In the present embodiment, the height of the first insulation layer 1310 is greater than the height of the contact pad 1200, so that the surface of the first insulation layer 1310 is higher than the surface of the contact pad 1200. It should be noted that the "height" here also refers to a distance from the surface of the structure (for example, a contact pad 1200) away from the base substrate to the base substrate. The height of the first insulation layer 1310 is increased, that is, the thickness of the first insulation layer 1310 increases, which can increase the structural strength of the part of the display substrate in the gap between the contact pads in different rows, thereby further reducing the risk of the gap between the contact pads being broken in the bonding process.

And, the first insulation layer 1310 covers edges of the plurality of contact pads 1200 and is configured to expose the surfaces of the plurality of contact pads away from the base substrate. As shown in FIG. 5C-FIG. 5E, in the bonding region, the first insulation layer 1310 has a plurality of openings corresponding to a plurality of contact pads one by one, that is, each opening exposes a surface of one contact pad away from the base substrate.

For example, each opening has a side wall surrounding the corresponding contact pad, and at least a part of or all of the side wall has a slope angle X1, which is acute, relative to the base substrate, and the value range of the slope angle X1 is about from 40 degrees to 60 degrees. For example, the value range of the slope angle X1 can also be selected from 45 degrees to 55 degrees, or the value of the slope angle X1 can be selected as about 50 degrees. Here, it should be noted that "about" means that the range of a value can vary within ±5% of a given value. The slope angle X1 can not only make the first insulation layer 1310 have an appropriate thickness to provide sufficient structural strength, but also reduce the step difference between the surface of the contact pad and the surface of the first insulation layer 1310, so that, during performing the bonding process, an anisotropic conductive adhesive can easily enter the plurality of openings and contact with the plurality of contact pads, thus improving the process yield.

Figure 5F:
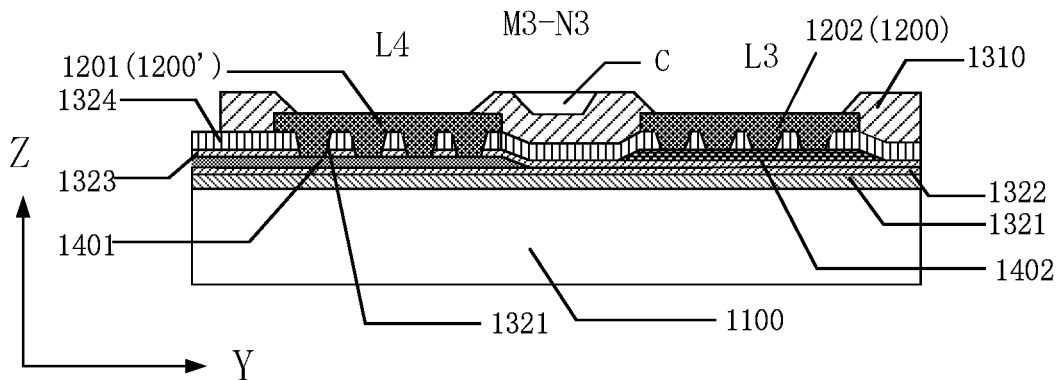
FIG. 5F is a cross-sectional view of the display substrate as shown in FIG. 5A along a line M3-N3 provided by another embodiment.
Figure 5G:
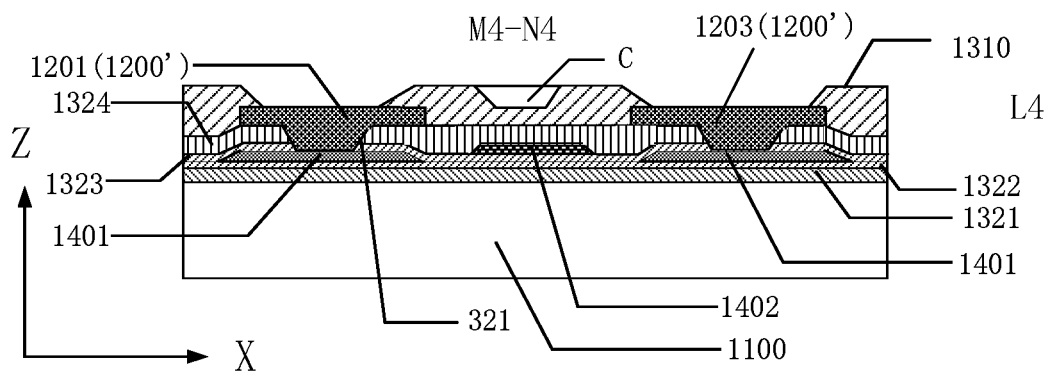
FIG. 5G is a cross-sectional view of the display substrate as shown in FIG. 5B(1) along a line M4-N4 provided by another embodiment.
Figure 5H:
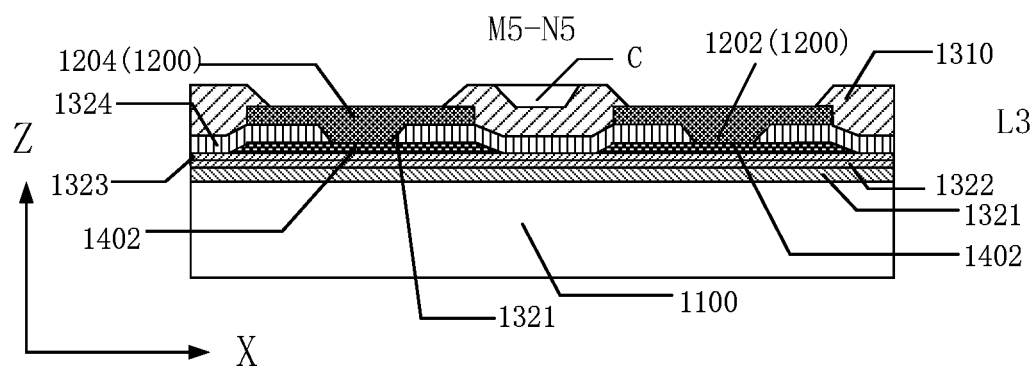
FIG. 5H is a cross-sectional view of the display substrate as shown in FIG. 5B(2) along a line M5-N5 provided by another embodiment.

In a variation of the above embodiment, as shown in FIG. 5F-FIG. 5H, the first insulation layer 1310 covers the edges of the plurality of contact pads 1200 and is configured to expose the surfaces of the plurality of contact pads away from the base substrate. In the bonding region, the first insulation layer 1310 has a plurality of openings corresponding to the plurality of contact pads one by one, that is, each opening exposes the surface of one contact pad away from the base substrate. The surface of the first insulation layer 1310 has recessed parts C at the gaps between contact pads of the second group of contact pads 1200 in the first row L3, at the gaps between contact pads of the first group of contact pads 1200' in the second row L4, and at the gap between the second group of contact pads 1200 in the first row L3 and the first group of contact pads 1200' in the second row L4. The recessed parts prevent the anisotropic conductive adhesive from flowing in the bonding process, thereby improving the yield of the bonding process.

For example, in some other examples of the present embodiment, the arrangement of the plurality of contact pads 1200 can also be set in one row, so that there will be no gap between the contact pads in different rows, and only the gap between the contact pads in the same row needs to be considered. Embodiments of the present disclosure do not limit the number of rows in which the contact pads in the bonding region are arranged.

In at least one example, at least one data lead line in the first group of data lead lines extends obliquely relative to an edge of the display substrate, or at least one data lead line in the second group of data lead lines extends obliquely relative to the edge of the display substrate.

Further, in at least one example, at least two data lead lines in the first group of data lead lines extend obliquely relative to the edge of the display substrate, and included angles of the at least two data lead lines in the first group of data lead lines relative to the edge of the display substrate in the same rotation direction are the same or complementary. Similarly, in at least one example, at least two data lead lines in the second group of data lead lines extend obliquely relative to the edge of the display substrate, and included angles of the at least two data lead lines in the second group of data lead lines relative to the edge of the display substrate in the same rotation direction are the same or complementary.

In an embodiment of the present disclosure, the included angle between the lead line, (that is, an extending direction of the lead line) and the edge of the display substrate is an angle at which the lead line rotates clockwise to coincide with the edge of the display substrate. In addition, the same rotation direction refers to a clockwise direction.

Referring to the examples in FIG. 5A, FIG. 5B(1), and FIG. 5B(2), data lead lines of the first group of data lead lines 1401 in the bonding region extend obliquely with relative to the edge of the display substrate, and the included angle between a data lead line of the first group of data lead lines 1401 and the edge of the display substrate is the angle at which the data lead line of the first group of data lead lines 1401 rotates in the clockwise direction S (shown in FIG. 5B(2)) to coincide with the edge of the display substrate. The data lead lines, on the left side in the figure, of the first group of data lead lines 1401 all have a first lead angle $\alpha 1$, and the data lead lines, on the right side in the figure, of the first group of data lead lines 1401 all have a second lead angle $\alpha 2$. For example, the first lead angle $\alpha 1$ and the second lead angle $\alpha 2$ are complementary to each other (that is, the sum of the first lead angle $\alpha 1$ and the second lead angle $\alpha 2$ is 180 degrees). Similarly, data lead lines of the second group of data lead lines 1402 in the bonding region extend obliquely with respect to the edge of the display substrate, and the data lead lines, on the left side in the figure, of the second group of data lead lines 1402 all have a third lead angle $\beta 1$, while the data lead lines, on the right side in the figure, of the second group of data lead lines 1402 all have a fourth lead angle $\beta 2$. For example, the third lead angle $\beta 1$ and the fourth lead angle $\beta 2$ are complementary to each other (that is, the sum of the third lead angle $\beta 1$ and the fourth lead angle $\beta 2$ is 180 degrees).

In at least one example, at least one contact pad of the first group of contact pads extends obliquely relative to an edge of the display substrate, or at least one contact pad of the second group of contact pads extends obliquely relative to the edge of the display substrate.

In at least one example, at least two contact pads of the first group of contact pads extend obliquely relative to the edge of the display substrate, and included angles of the at least two contact pads of the first group of contact pads relative to the edge of the display substrate in the same rotation direction are the same or complementary. For example, in at least one example, at least two contact pads of the second group of contact pads extend obliquely relative to the edge of the display substrate, and included angles of the at least two contact pads of the second group of contact pads relative to the edge of the display substrate in the same rotation direction are the same or complementary.

Referring to the examples in FIG. 5A, FIG. 5B(1), and FIG. 5B(2), the contact pads of the first group of contact pads in the L4 row of the bonding region extend obliquely relative to the edge of the display substrate, and the contact pads, on the left side in the figure, of the first group of contact pads all have a first contact pad angle A1, while the contact pads, on the right side in the figure, of the first group of contact pads all have a second contact pad angle A2. For example, the first contact pad angle A1 and the second contact pad angle A2 are complementary to each other (that is, the sum of the first contact pad angle A1 and the second contact pad angle A2 is 180 degrees). Similarly, the contact pads of the second group of contact pads in L3 row of the bonding region extend obliquely relative to the edge of the display substrate, and the contact pads, on the left side in the figure, of the second group of contact pads all have a third contact pad angle B1, while the contact pads, on the right side in the figure, of the second group of contact pads all have a fourth contact pad angle B2. For example, the third contact pad angle B1 and the fourth contact pad angle B2 are complementary to each other (that is, the sum of the third contact pad angle B1 and the fourth contact pad angle B2 is 180 degrees).

For example, in at least one example, as shown in FIG. 5B(2), the first lead angle α1 is equal to the first contact pad angle A1, and the third lead angle β1 is equal to the third contact pad angle B1.

For example, as shown in FIG. 5B(2), at least one of the plurality of contact pads has a length Y1, and the value of the length Y1 ranges from about 650 microns to 750 microns, for example, the value of the length Y1 can range from about 680 microns to 720 microns, or the value of the length Y1 can be about 700 microns. At least one of the plurality of contact pads also has a width Z1, the value of the width Z1 ranges from about 34 microns to 42 microns. For example, the width Z1 can range from about 36 microns to about 40 microns, or the width Z1 can be about 38 microns. It should be noted that the word "about" indicates that the range of a value can vary within ±5% of a given value.

For example, the material of the buffer layer 1321 may include insulation materials such as silicon oxide, silicon nitride, and silicon oxynitride, etc. The first gate insulation layer 1322, and the second gate insulation layer 1323 may include insulation materials such as silicon oxide, and silicon nitride, etc. The interlayer insulation layer 1324 may include insulation materials such as silicon oxide, and silicon nitride, etc.

For example, in at least one embodiment of the present disclosure, the buffer layer, the first gate insulation layer, the second gate insulation layer, the interlayer insulation layer, the first group of data lead lines, and the second group of data lead lines in the bonding region can be formed together with the corresponding structural layers in the display region, thereby reducing the flow of the manufacturing process of the display substrate.

For example, the first insulation layer 1310 of the display substrate provided by at least one embodiment of the present disclosure continues to extend from the bonding region 1200 to the periphery, so that the region covered by the first insulation layer 1310 is larger than the bonding region. For example, the first insulation layer 1310 covers part or all of the regions except the bonding region, as shown in FIG. 5A, the first insulation layer 1310 covers the peripheral region 1103 surrounding the bonding region. As shown in FIG. 5A, a length D represents the distance that the first insulation layer 1310 in the peripheral region 1103 extends from one side of the bonding region 1200. For example, the length D may be about 40 microns to 60 microns, such as 50 microns, etc. The bonding region is located in the coverage region of the first insulation layer 1310, so as to reduce the risk of fracture and crack in the bonding region during the bonding process.

Figure 6:
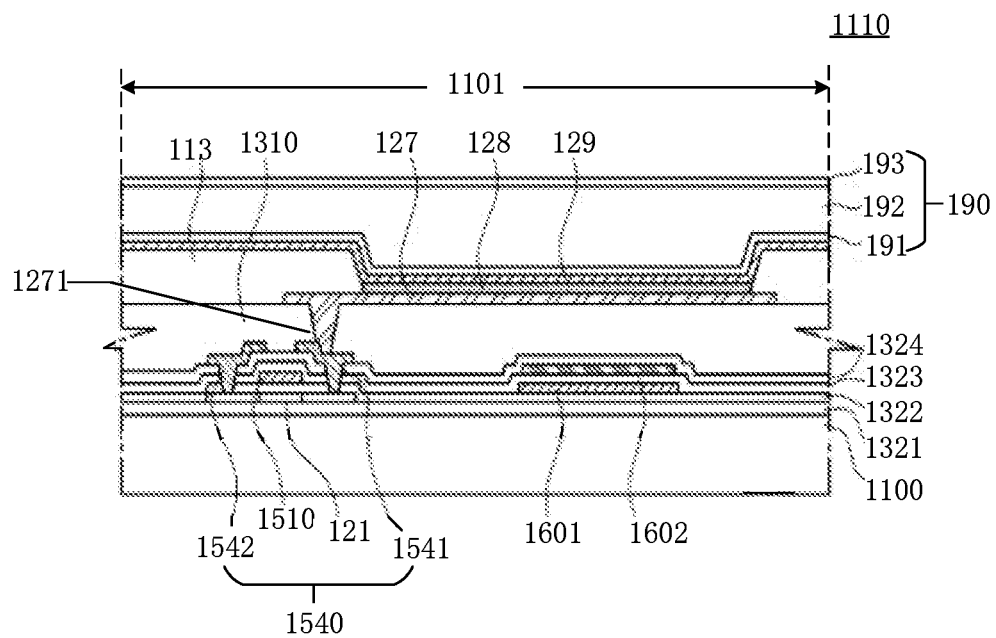
FIG. 6 is a cross-sectional view of the display substrate as shown in FIG. 5B.

For example, as shown in FIG. 6, the pixel array in the display region 1101 of the display substrate includes a plurality of sub-pixels 1110, each of the plurality of sub-pixels may include a pixel circuit, a planarization layer, and a light-emitting element, and the pixel circuit includes a plurality of thin film transistors and a storage capacitor. The planarization layer is located on a side of a thin film transistor away from the base substrate to cover the thin film transistor and the storage capacitor, the light-emitting element is located on a side of the planarization layer away from the base substrate, the planarization layer includes a first planarization layer via, the thin film transistor includes an active layer on the base substrate, a gate electrode on a side of the active layer away from the base substrate, and a source electrode and a drain electrode on a side of the gate electrode away from the base substrate, and one of the source electrode and the drain electrode is electrically connected with the light-emitting element through the first planarization layer via, and the first insulation layer and the planarization layer are arranged in the same layer.

The light-emitting element may be an organic light-emitting diode (OLED) or a quantum dot light-emitting diode (QLED). The type of the pixel circuit is as described above, and will not be repeated here, and the embodiments of the present disclosure do not limit this.

For example, a part of the structures of the display region and the bonding region are formed in the same layer and made of the same material, thus reducing the flow of the manufacturing process.

For example, in at least one embodiment of the present disclosure, as shown in the partial structural schematic diagram of the sub-pixel 1110 in FIG. 6, the buffer layer 1321 of the display region 1101 is arranged on the base substrate 1100 to provide a flat surface for forming the pixel circuit and to prevent impurities that may exist in the base substrate from diffusing into the pixel circuit and adversely affecting the performance of the pixel circuit. The buffer layer 1321 in the display region and the buffer layer 1321 in the bonding region are arranged in the same layer. For example, a barrier layer may also be arranged between the buffer layer 1321 and the base substrate 1100.

For example, the material of the buffer layer 1321 may include insulation materials such as silicon oxide, silicon nitride, and silicon oxynitride, etc.

For example, as shown in FIG. 6, a semiconductor layer 121 in the display region 1101 is disposed on the buffer layer 1321 of the display region. The semiconductor layer 121 may include polysilicon or oxide semiconductor, and the semiconductor layer 121 including oxide semiconductor may be covered with a separate passivation layer (not shown). The semiconductor layer 121 includes a channel region that is not doped with impurities, and a source region and a drain region that are located at opposite sides of the channel region and are doped with impurities (N-type impurities or P-type impurities).

For example, as shown in FIG. 6, the first gate insulation layer 1322 in the display region 1101 (that is, a display region first gate insulation layer) is disposed on the semiconductor layer 121. The first gate insulation layer 1322 in the display region and the first gate insulation layer 1322 in the bonding region are arranged in the same layer. The gate electrode 1510 and a first capacitor electrode 1601 are arranged on the first gate insulation layer 1322. The gate electrode 1510 overlaps the channel region of the semiconductor layer 121. The gate electrode 1510 is manufactured by the same material as the first capacitor electrode 1601, and the gate electrode 1510, the first capacitor electrode 1601, and the first group of data lead lines 1401 are arranged in the same conductive layer, and the conductive layer can be referred to as a second conductive layer.

For example, in the example shown in FIG. 6, the second gate insulation layer 1323 in the display region 1101 (that is, a display region second gate insulation layer) may be disposed on the gate electrode 1510 and the first capacitor electrode 1601, and a second capacitor electrode 1602 is disposed on the second gate insulation layer 1323. The second capacitor electrode 1602 overlaps with the first capacitor electrode 1601, for example, the second capacitor electrode 1602 and the first capacitor electrode 1601 at least partially overlap in the direction perpendicular to the base substrate 1100. The first capacitor electrode 1601 and the second capacitor electrode 1602 use the second gate insulation layer 1323 as a dielectric material to form a storage capacitor. The second gate insulation layer 1323 in the display region and the second gate insulation layer 1323 in the bonding region are arranged in the same layer. The second capacitor electrode 1602 and the second group of data lead lines 1402 in the bonding region are arranged in the same conductive layer, and for example, are arranged in the same layer as gate electrodes of transistors on the display substrate other than the transistors shown in FIG. 6, and for example, are also arranged in the same layer as a power supply line for supplying power voltage to the pixel circuit. The conductive layer can be referred to as a second gate conductive layer.

In another example, as a modification of the example as shown in FIG. 6, the first capacitor electrode of the storage capacitor is still arranged in the same layer as the gate electrode 1510, while the second capacitor electrode of the storage capacitor is arranged in the same layer as the source electrode 1541 and the drain electrode 1542 in the thin film transistor. In this example, the second group of data lead lines 1402 is no longer arranged in the same layer as the second capacitor electrode.

In still another example, as a modification of the example as shown in FIG. 6, the first capacitor electrode of the storage capacitor is no longer arranged in the same layer as the gate electrode 1510, but is located between the second gate insulation layer 1323 and the interlayer insulation layer 1324 (that is, the display region interlayer insulation layer), while the second capacitor electrode of the storage capacitor is arranged in the same layer as the drain electrode 1541 and the source electrode 1542 in the thin film transistor. In this example, the second group of data lead lines 1402 is no longer arranged in the same layer as the second capacitor electrode, but is arranged in the same layer as the first capacitor electrode.

For example, in some embodiments, the material of the gate electrode may include a metal material or an alloy material, such as a metal single-layer or a multi-layer structure formed by molybdenum, aluminum, titanium, etc., for example, the multi-layer structure is a multi-metal laminated layer (such as a three-layer metal laminated layer of titanium, aluminum, and titanium (Ti/Al/Ti). Materials of the first capacitor electrode and the second capacitor electrode may include one or more selected from a group consisting of gold, silver, copper, nickel, platinum, aluminum, molybdenum, etc.

For example, as shown in FIG. 6, the interlayer insulation layer 1324 in the display region 1101 may be arranged on the second capacitor electrode 1602, and a source-drain electrode layer 1540 is arranged on the interlayer insulation layer 1324. The source-drain electrode layer 1540 of the thin film transistor includes a drain electrode 1541 and a source electrode 1542. The interlayer insulation layer 1324 in the display region and the interlayer insulation layer 1324 in the bonding region are arranged in the same layer. The drain electrode 1541 and the source electrode 1542 may include a metal single layer or multiple layers formed of molybdenum, aluminum, titanium, etc. The drain electrode 1541 and the source electrode 1542 are arranged in the same layer as the plurality of contact pads in the bonding region.

In the present embodiment, the thin film transistor in the display substrate can be a top gate thin film transistor as shown in FIG. 6, but can also be set as a bottom gate thin film transistor, a double gate thin film transistor, or other types of thin film transistors, which is not limited in the present embodiment.

For example, as shown in FIG. 6, the first insulation layer 1310 in the display region 1101 covers the thin film transistor, and the OLED is formed on the first insulation layer 1310, and the first insulation layer 1310 in the display region 1101 serves as a planarization layer 1310. The first insulation layer 1310 may include an organic insulation material or an inorganic insulation material, or may be formed by a combination of an organic insulation material and an inorganic insulation material. The first insulation layer 1310 in the display region and the first insulation layer 1310 in the bonding region are formed in the same layer.

For example, as shown in FIG. 6, the OLED as a light-emitting element in the sub-pixel of the display region 1101 includes a pixel electrode 127, a light-emitting layer 128, and a common electrode 129. The pixel electrode 127 is separately formed in each sub-pixel on the first insulation layer 1310 as a planarization layer, and is connected to the drain electrode 1542 of the thin film transistor through a via 1271 formed in the first insulation layer 1310. A pixel defining layer (or a partition wall) 113 is arranged on the first insulation layer 1310 and on the edge of the pixel electrode 127. The light-emitting layer 128 is disposed on the pixel electrode 127, and the common electrode 129 is disposed on the entire of the display region. The pixel electrode 127 may include a reflective layer, and the common electrode 129 may include a transparent layer or a semi-transparent layer. Thus, the light emitted from the light-emitting layer 128 is reflected by the pixel electrode 127, and passes through the common electrode 129 to be emitted into the external environment, so that the display function is implemented. In the case where the common electrode 129 includes a semi-transmissive layer, some light reflected by the pixel electrode 127 is reflected again by the common electrode 129, so that the pixel electrode 127 and the common electrode 129 form a resonant structure, thereby improving light extraction efficiency.

For example, the material of the pixel electrode 127 may include at least one transparent conductive oxide material, which includes indium tin oxide (ITO), indium zinc oxide (IZO), zinc oxide (ZnO), etc. In addition, the pixel electrode 127 may adopt a metal having high reflectivity as a reflective layer, such as silver (Ag).

For example, for OLED, the light-emitting layer 128 may adopt a small molecular organic material or a polymer molecular organic material, which may be a fluorescent light-emitting material or a phosphorescent light-emitting material, and may emit red light, green light, blue light, or white light. In addition, the light-emitting layer may further include functional layers such as an electron injection layer, an electron transport layer, a hole injection layer, a hole transport layer, and the like as required. For QLED, the light-emitting layer may adopt a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dot is 2~20 nm.

For example, the common electrode 129 may adopt various conductive materials. For example, the common electrode 129 may adopt a metal material such as lithium (Li), aluminum (Al), magnesium (Mg), silver (Ag), etc.

For example, the material of the pixel defining layer 113 may include organic insulation materials such as polyimide, polyphthalimide, polyphthalamide, acrylic resin, benzocyclobutene or phenolic resin, etc., or inorganic insulation materials such as silicon oxide, silicon nitride, etc., and the embodiments of the present disclosure are not limited thereto.

For example, as shown in FIG. 6, the display substrate may further include an encapsulation layer 190 covering the light-emitting element and the pixel circuit. The encapsulation layer 190 seals the OLED, so that deterioration of the OLED caused by moisture and/or oxygen included in the environment can be reduced or prevented. The encapsulation layer 190 may include a structure in which inorganic layers and organic layers are stacked. For example, in one example, the encapsulation layer 190 may include a first inorganic layer 191, an organic layer 192, and a second inorganic layer 193. For example, the encapsulation layer 190 may extend to the bonding region, but the encapsulation layer does not cover the plurality of contact pads.

For example, the material of the encapsulation layer may include insulation materials such as silicon nitride, silicon oxide, silicon oxynitride, polymer resin, etc. Inorganic materials such as silicon nitride, silicon oxide, and silicon oxynitride have high compactness and can prevent penetration of water, oxygen, etc. The material of the organic encapsulation layer may be a polymer material containing a desiccant or a polymer material configured to block water vapor, such as a polymer resin or the like, to planarize the surface of the display substrate, and to relieve the stress of the first inorganic encapsulation layer and the second inorganic encapsulation layer. The material of the organic encapsulation layer may further include a water absorbent material such as a desiccant to absorb substances such as water and oxygen that have penetrated into the interior of the display substrate.

In the embodiments of the present disclosure, "arranged in the same layer" means that two structures (for example, the contact pad 1200 and the source-drain electrode layer 1540) are arranged in the same layer and formed by the same material, that is, the two structures are formed by the same material layer, for example, can be formed by the same material layer through a patterning process.

At least one embodiment of the present disclosure also provides a display device, and the display device may include the display substrate according to any one of the embodiments as shown in FIG. 5A-FIG. 5E and FIG. 6. In addition, the display device includes a flexible printed circuit board, a control chip is arranged on the flexible printed circuit board, and the flexible printed circuit board is electrically connected with the plurality of contact pad 1200.

For example, the control chip may be a central processing unit, a digital signal processor, a system chip (SoC), etc. For example, the control chip may also include a memory, a power supply module, etc., and a function of supplying power and a function of inputting and outputting signals are achieved through additionally arranged wires, signal lines, etc. For example, the control chip may further include a hardware circuit, computer executable codes, etc. The hardware circuit may include conventional very large scale integration (VLSI) circuits or gate arrays, and existing semiconductors such as logic chips, transistors, or other discrete components. The hardware circuit may further include field programmable gate arrays, programmable array logic, programmable logic devices, etc.

At least one embodiment of the present disclosure further provides a manufacturing method for a display substrate, and the manufacturing method includes: providing a base substrate, where the base substrate comprises a display region and a bonding region on at least one side of the display region; forming a plurality of sub-pixels and a plurality of data lines in the display region, where the plurality of data lines are configured to provide data signals to the plurality of sub-pixels; forming a plurality of data lead lines in the bonding region; forming at least one group of contact pads in the bonding region, where the at least one group of contact pads comprises a first group of contact pads and a second group of contact pads, each of the first group of contact pads and the second group of contact pads comprises a plurality of contact pads, the second group of contact pads are on a side of the first group of contact pads away from the display region, and the plurality of data lead lines are electrically connected with the first group of contact pads and the second group of contact pads in one-to-one correspondence manner; and forming a first insulation layer in the bonding region, where the first insulation layer is in gaps between the plurality of contact pads and covers edges of the plurality of contact pads, and is configured to expose surfaces, away from the base substrate, of the plurality of contact pads.

For example, in the manufacturing method of the above embodiment, the first insulation layer is formed such that a vertical distance between a surface of the first insulation layer away from the base substrate and the base substrate is not less than a vertical distance between the surfaces of the plurality of contact pads away from the base substrate and the base substrate.

For example, in the manufacturing method of the above embodiment, forming the first insulation layer in the bonding region includes: after forming the plurality of contact pads, depositing a first material layer on the base substrate to planarize the surface of the display substrate; performing a patterning process on the first material layer to make the part of the first material layer located in the display region be formed as a planarization layer, removing the part of the first material layer overlapping with the plurality of contact pads, and thinning the part, which is located in the bonding region and in the gaps between the plurality of contact pads, of the first material layer to form the first insulation layer.

For example, in the manufacturing method of the above embodiment, the first insulation layer is formed to cover an edge of each of the plurality of contact pads and includes a plurality of openings to expose surfaces of the plurality of contact pads away from the base substrate, respectively.

For example, in the manufacturing method of the above embodiment, performing the patterning process on the first material layer includes: coating a photoresist on the first material layer; providing a first mask plate to expose and develop the photoresist to remove the parts of the photoresist overlapping with the plurality of contact pads; patterning the first material layer with the remaining photoresist as a mask to remove the parts of the first material layer overlapping with the plurality of contact pads; removing the remaining photoresist in the bonding region; and in the bonding region, etching a part, which is located in gaps between the plurality of contact pads and is away from the base substrate, of the surface of the first material layer, so that the remaining first material layer is formed as the first insulation layer.

For example, in the manufacturing method of the above embodiment, performing the patterning process on the first material layer includes: coating a photoresist on the first material layer; exposing the photoresist using a gray tone mask or a halftone mask, developing the exposed photoresist to remove the parts of the photoresist overlapping with the plurality of contact pads, and thinning the parts of the photoresist overlapping with the gaps between the plurality of contact pads; and etching the first material layer in the bonding region to remove the parts of the first material layer overlapping with the plurality of contact pads, performing an ashing process to remove the parts of the photoresist overlapping with the gaps between the plurality of contact pads, and removing a part thickness of a part, which is away from the base substrate and overlaps with the gaps between the plurality of contact pads, of the first material layer.

For example, in the manufacturing method of the above embodiment, the first material layer includes a photosensitive resin material, and performing the patterning process on the first material layer includes: exposing the first material layer using a gray tone mask or a halftone mask, developing the exposed photoresist so that the part of the first material layer located in the display region is formed as the planarization layer, removing the parts of the first material layer overlapping with the plurality of contact pads, and thinning the parts, which are located in the bonding region and in the gaps between the plurality of contact pads, of the first material layer to form the first insulation layer.

For example, in the manufacturing method of the above embodiment, each of the plurality of contact pads includes at least one metal layer, and forming the plurality of contact pads includes: depositing a first conductive material thin film on the base substrate and performing a patterning process on the first conductive material thin film, where the part, which is located in the display region, of the first conductive material thin film is formed as a first conductive layer, and the part, which is located in the bonding region, of the first conductive material thin film is formed as at least one metal layer of the plurality of contact pads, at least one of the plurality of sub-pixels includes a thin film transistor, the planarization lay is located on a side of the thin film transistor away from the base substrate, and the thin film transistor includes a source electrode and a drain electrode located in the first conductive layer.

For example, in the manufacturing method of the above embodiment, the plurality of data lead lines comprise a first group of data lead lines and a second group of data lead lines, data lead lines of the first group of data lead lines are electrically connected with contact pads of the first group of contact pads in one-to-one correspondence manner, data lead lines of the second group of data lead lines are electrically connected with contact pads of the second group of contact pads in one-to-one correspondence manner, and relative to the base substrate, the first group of data lead lines and the second group of data lead lines are respectively located in different layers. Forming the plurality of data lead lines in the bonding region includes: forming a first interlayer insulation layer on the base substrate; forming the first group of data lead lines on the first interlayer insulation layer in the bonding region, forming a second interlayer insulation layer on the base substrate to cover the first group of data lead lines, and forming the second group of data lead lines on the second interlayer insulation layer in the bonding region; or, forming the second group of data lead lines on the first interlayer insulation layer in the bonding region, forming a second interlayer insulation layer on the base substrate to cover the second group of data lead lines, forming the first group of data lead lines on the second interlayer insulation layer in the bonding region; the plurality of contact pads and the first insulation layer are formed on the second interlayer insulation layer.

For example, in the manufacturing method of the above embodiment, forming a plurality of data lead lines in the bonding region further includes: forming a plurality of first contact pad vias passing through the first interlayer insulation layer, so that the contact pads of the first group of contact pads are electrically connected with the data lead lines of the first group of data lead lines through the plurality of first contact pad vias in one-to-one correspondence manner, and forming a plurality of second contact pad vias passing through the first interlayer insulation layer and the second interlayer insulation layer, so that the contact pads of the second group of contact pads are electrically connected with the data lead lines of the second group of data lead lines through the second contact pad vias in one-to-one correspondence manner; or, forming a plurality of second contact pad vias passing through the first interlayer insulation layer, so that the contact pads of the second group of contact pads are electrically connected with the data lead lines of the second group of data lead lines through the plurality of second contact pad vias in one-to-one correspondence manner, and forming a plurality of first contact pad vias passing through the first interlayer insulation layer and the second interlayer insulation layer, so that the contact pads of the first group of contact pads are electrically connected with the data lead lines of the first group of data lead lines through the plurality of first contact pad vias in one-to-one correspondence manner.

For example, in the manufacturing method of the above embodiment, at least one of the plurality of sub-pixels further includes a storage capacitor, the storage capacitor includes two capacitor electrodes, and the thin film transistor includes a gate electrode. The manufacturing method further includes: forming the first group of data lead lines and the gate electrode in the same layer, and forming the second group of data lead lines and one of the two capacitor electrodes of the storage capacitor in the same layer; or, forming the second group of data lead lines and the gate electrode in the same layer, and forming the first group of data lead lines and one of two capacitor electrodes of the storage capacitor in the same layer.

For example, in the manufacturing method of the above embodiment, the two capacitor electrodes include a first capacitor electrode and a second capacitor electrode, the first capacitor electrode and the gate electrode are arranged in the same layer, and in the display region, the second capacitor electrode is arranged between the first interlayer insulation layer and the second interlayer insulation layer.

Referring to the display substrate according to any one of the embodiments as shown in FIG. 5A to FIG. 5E, and FIG. 6, a manufacturing method according to at least one embodiment of the present disclosure will be described.

The manufacturing method for the display substrate according to any of the embodiments as shown in FIG. 5A to FIG. 5E, and FIG. 6 will be described in detail below. The height of the first insulation layer in the bonding region is greater than the height of the contact pad in the bonding region, and the manufacturing process of the display substrate is shown in FIG. 7A to FIG. 7L.

Figure 7A:
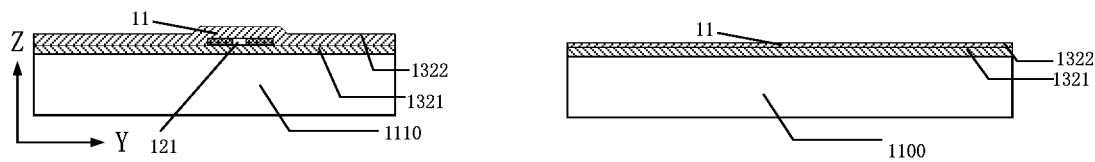
FIGS. 7A to 7L are process diagrams of another manufacturing method for a display substrate provided by some embodiments of the present disclosure.

As shown in FIG. 7A, a base substrate 1100 is provided and an insulation material is deposited on the base substrate 1100 to form a buffer layer 1321, for example, the buffer layer covers the display region 1101 and the bonding region 1102. A semiconductor material is deposited on the buffer layer of the display region to form a semiconductor layer 121, the semiconductor layer 121 includes a channel region that is not doped with impurities in the middle of the semiconductor layer 121, a source region and a drain region that are located at opposite sides of the channel region and doped with impurities (N-type impurities or P-type impurities). An insulation material 11 is deposited on the buffer layer of the bonding region 1102 and the display region 1101 to form a first gate insulation layer.

For example, in the embodiments of the present discourse, the base substrate may be a glass plate, a quartz plate, a metal plate, a resin plate, etc. For example, the material of the base substrate may include an organic material, for example, the organic material may be a resin material such as polyimide, polycarbonate, polyacrylate, polyetherimide, polyethersulfone, polyethylene terephthalate, and polyethylene naphthalate, etc. For example, the base substrate may be formed by a plurality of material layers, for example, the base substrate may include a base, and the material of the base may be composed of the above materials. A buffer layer can be formed on the surface of the base as a transition layer, that is, the buffer layer can not only prevent harmful substances in the base substrate from penetrating into the display substrate, but also increase the adhesion of the film layer in the display substrate to the base substrate. For example, the material of the buffer layer can be silicon oxide, silicon nitride, silicon oxynitride, etc.

Figure 7B:
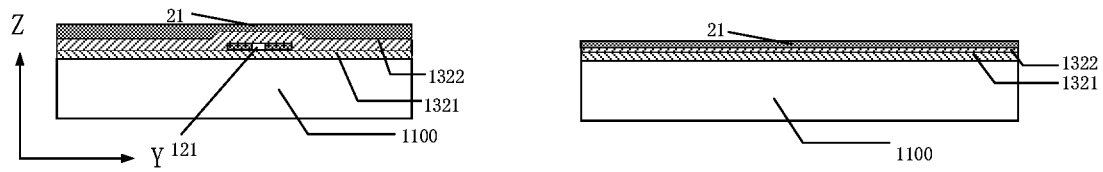
Figure 7C:
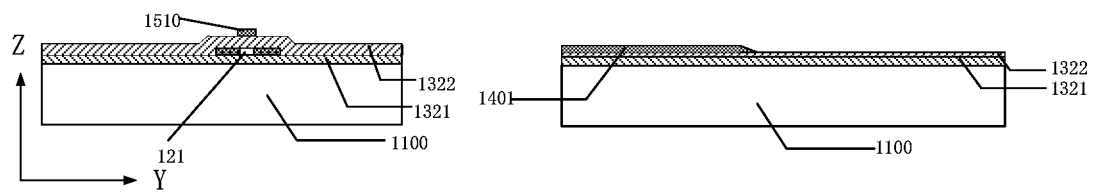

As shown in FIG. 7B, a first conductive material is deposited on the first gate insulation layer 1322 in the bonding region 1102 and the display region 1101 to form a first conductive material layer 21. As shown in FIG. 7C, a patterning process is performed on the first conductive material layer. The part of the first conductive material layer 21 located in the display region is formed as the gate electrode 1510 and the first capacitor electrode 1601, and the part of the first conductive material layer 21 located in the bonding region is formed as the first group of data lead lines 140. For example, the first conductive material layer 21 may be metal or metal alloy, or other conductive materials. For example, the first conductive material layer 21 may have a single layer structure, or may be a laminated layer composed of a plurality of film layers, for example, a laminated layer composed of three metal film layers of Ti-AL-Ti.

In this step, in some examples, the gate electrode 1510 can be used as a mask to form a source region and a drain region, which are conductive, by doping the active layer, while the channel region between the source region and the drain region is not doped due to the shielding effect of the gate electrode.

Figure 7D:
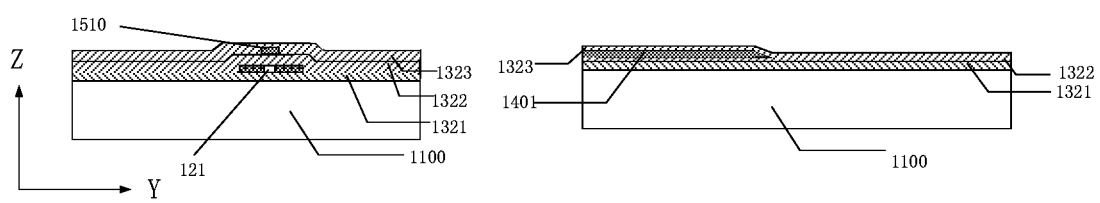

As shown in FIG. 7D, an insulation material is deposited in the display region and the bonding region to form a second gate insulation layer 1323 covering the gate electrode 1510 in the display region and a second gate insulation layer 1323 covering the first group of data lead lines 1401 in the bonding region.

Figure 7E:
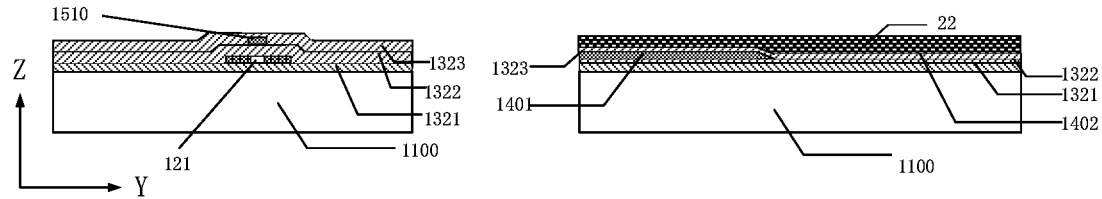

As shown in FIG. 7E, a second conductive material is deposited on the second gate insulation layer 1323 in the bonding region 1102 to form a second conductive material layer 22. For example, the second conductive material layer 22 may be metal or metal alloy, or other conductive materials. For example, the second conductive material layer 22 may have a single layer structure, or may be a laminated layer composed of a plurality of film layers, for example, a laminated layer composed of three metal film layers of Ti-AL-Ti.

Figure 7F:
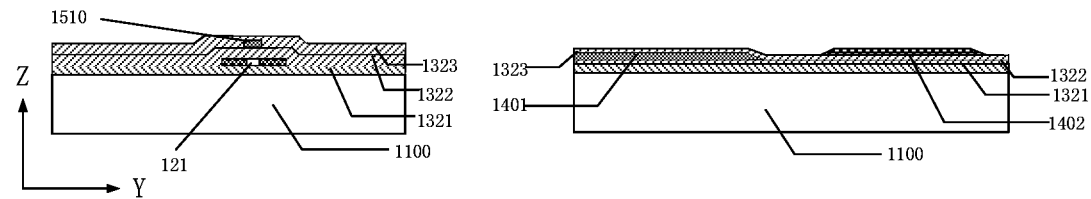

As shown in FIG. 7F, a patterning process is performed on the second conductive material layer 22, and the part of the second conductive material layer 22 located in the bonding region is formed as a second group of data lead lines 1402, while the part of the second conductive material layer 22 located in the display region is formed as a second capacitor electrode 1602.

Figure 7G:
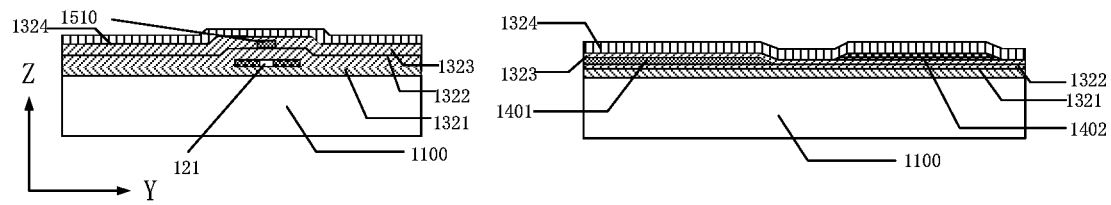

As shown in FIG. 7G, an insulation material is deposited in the display region and the bonding region to form an interlayer insulation layer 1324 covering the second gate insulation layer 1323 in the display region and an interlayer insulation layer 1324 covering the second group of data lead lines 1402 in the bonding region.

Figure 7H:
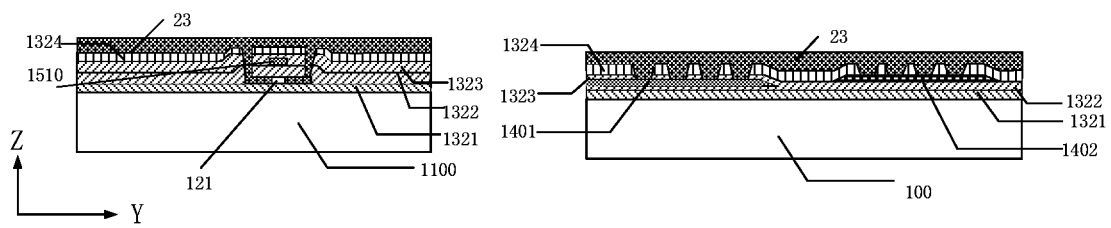

As shown in FIG. 7H, a patterning process is performed on the second gate insulation layer 1323 and the interlayer insulation layer 1324, which overlap with the first group of data lead lines 1401 in the bonding region, to form one via or more vias in the second gate insulation layer 1323 and the interlayer insulation layer 1324. In addition, a patterning process is performed on the interlayer insulation layer 1324 overlapping with the second group of data lines in the bonding region to form one via or more vias in the interlayer insulation layer 1324. A patterning process is performed on the first gate insulation layer 1322, the second gate insulation layer 1323, and the interlayer insulation layer 1324 in the display region to form vias in the first gate insulation layer 1322, the second gate insulation layer 1323, and the interlayer insulation layer 1324. Then, a third conductive material layer 23 is deposited in the display region and the bonding region. The third conductive material layer 23 is respectively connected with the active layer 121, the first group of data lead lines 1401, and the second group of data lead lines 1402 through vias. For example, the third conductive material layer 23 may be metal or metal alloy, or other conductive materials. For example, the third conductive material layer 23 may have a single layer structure, or may be a laminated layer composed of a plurality of film layers, for example, a laminated layer composed of three metal film layers of Ti-AL-Ti.

Figure 7I:
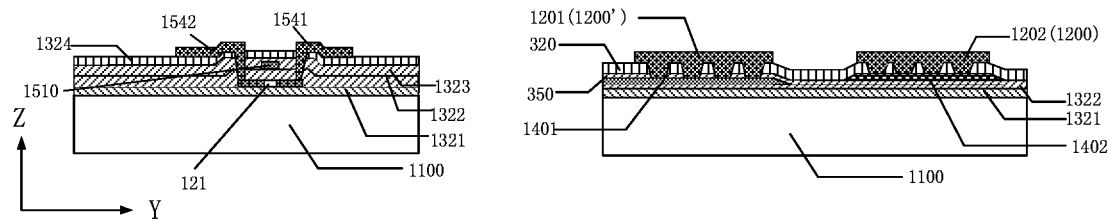

As shown in FIG. 7I, a patterning process is performed on the third conductive material layer 23, and the part of the third conductive material layer 23 located in the display region is formed as a drain electrode 1541 and a source electrode 1542. The part of the third conductive material layer 23 located in the bonding region is formed as a plurality of contact pads 1200.

Figure 7J:
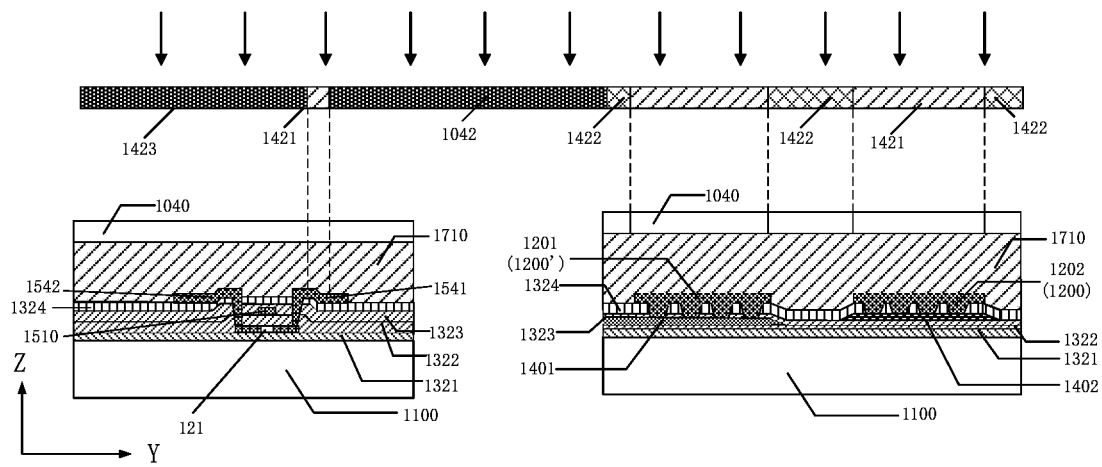

As shown in FIG. 7J, a first insulation material layer 1710 is deposited on the display region and the bonding region to planarize the surface of the display substrate, that is, the first insulation material layer 1710 covers the thin film transistor and the plurality of contact pads 1200, and the surface of the first insulation material layer 1710 away from the base substrate 1100 is a plane. For example, the manufacturing material of the first insulation material layer may include organic materials such as polymer resin, for example, may comprise polyimide, polyacrylate, polyacrylate polyurethane, polyurea, polyaromatic esters, or others. The first insulation material layer 1710 is covered with a photoresist 1040. A third mask plate 1042 is provided to expose the photoresist 1040. In the bonding region, the third mask plate 1042 includes a first light-transmitting pattern 1421 overlapping a contact pad 1201 and a contact pad 1202, and a second light-transmitting pattern 1422 overlapping the gap between the contact pad 1201 and the contact pad 1202. In the display region, the third mask plate 1042 includes a first light-transmitting pattern 1421 and a non-light-transmitting pattern 1423 overlapping the via in the planarization layer. That is, the third mask plate 1042 is a gray tone mask plate or a halftone mask plate. The photoresist is a positive photoresist, and correspondingly, the light transmittance of the first light-transmitting pattern 1421 is greater than the light transmittance of the second light-transmitting pattern 1422. During the exposing process, in a case where the part of the photoresist 1040 corresponding to the first light-transmitting pattern 1421 can be completely exposed, the part of the photoresist 1040 corresponding to the second light-transmitting pattern 1422 is partially exposed, and the part of the photoresist 1040 corresponding to the non-light-transmitting pattern 1423 is not exposed.

Figure 7K:
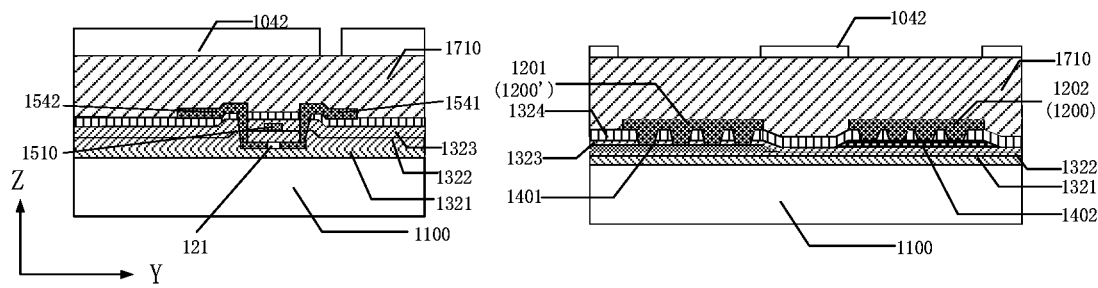

As shown in FIG. 7K, the photoresist 1040 is developed, and the exposed part of the photoresist 1040 is removed, that is, in the bonding region, the photoresist 1040 overlapping the plurality of contact pads 1200 is removed, the remaining photoresist 1040 is thinned, and in the display region, the photoresist overlapping the vias in the planarization layer is removed. After developing, the photoresist 1040 is formed as a third photoresist pattern 1042. The first insulation material layer 1710 is etched to remove the insulation material layer overlapped with the plurality of contact pads, and a via 1271 is formed in the display region.

Figure 7L:
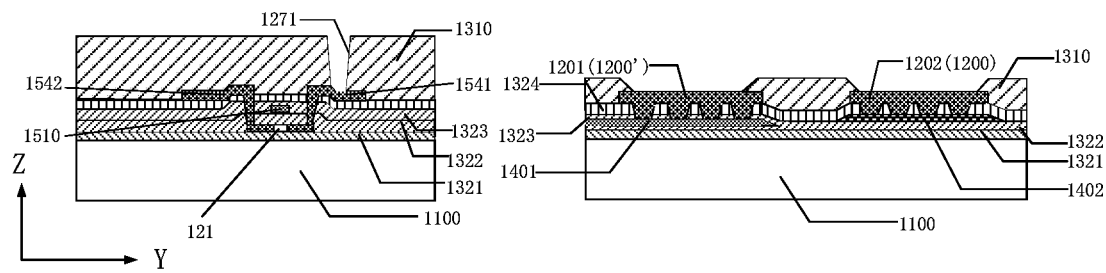

As shown in FIG. 7L, the third photoresist pattern 1042 in the bonding region is removed, then the remaining first insulation material layer 1710 in the bonding region is etched and an etching thickness is controlled, and the part thickness of the part, which overlaps the gaps between the plurality of contact pads and is away from the base substrate, of the insulation material layer is removed to form a first insulation layer 1310 with a height greater than the height of the contact pad. Then, the photoresist 1042 in the display region is removed, and the first insulation layer 1310, which serves as a planarization layer, is formed by etching and controlling the etching thickness. According to the control of the thickness of the remaining first insulation material layer 1710 in the bonding region to form the first insulation layer 1310 in the bonding region, so that the display substrate of the embodiment as shown in FIG. 5C can be obtained. In order to control the etching thickness of the first insulation material layer 1710, an etching endpoint detector can be used for real-time monitoring, or the etching solution concentration and/or etching time can be adjusted according to experimental data.

After that, for example, subsequent processes may be continued on the planarization layer of the display region, and include forming of a light-emitting element, a pixel defining layer, an encapsulation layer, etc., which will not be described in detail here.

In the display substrate obtained by the above manufacturing method, the first insulation layer can reduce or eliminate the step difference between the contact pad and the gap between the contact pad. In the bonding process, the force applied by the force head on the surface of the first insulation layer and the surface of the plurality of contact pads is uniformly distributed (for example, the pressure of the force is equal), that is, the force applied by the force head on the plurality of contact pads and the gaps between the plurality of contact pads is distributed more evenly. The display substrate (a bonding region of the display substrate) will not be damaged due to uneven pressure in the bonding process, so that, in actual manufacturing, the yield of the display substrate is improved.

Various embodiments and technical solutions described in the present disclosure may be described as examples listed below.

A display substrate includes a base substrate, including a display region and a bonding region located on at least one side of the display region; a plurality of contact pads, located in the bonding region and having gaps between each other; a first insulation layer, located in the gaps between the plurality of contact pads and configured to expose surfaces of the plurality of contact pads away from the base substrate.

A surface of the first insulation layer away from the base substrate is higher than a surface of the contact pad away from the base substrate, or the surface of the first insulation layer away from the base substrate and the surface of the contact pad away from the base substrate are located in the same plane.

The plurality of contact pads are arranged in at least one row, the direction of the row is parallel to an extending direction of a side edge of the display region facing the bonding region, and at least a part of the first insulation layer is located in the gaps between the plurality of contact pads in one row.

The display substrate further includes a plurality of lead lines, the plurality of lead lines are electrically connected with the plurality of contact pads in one-to-one correspondence manner, an end part of each of the plurality of lead lines is electrically connected with a corresponding one contact pad of the plurality of contact pads, and the other end part of each of the plurality of lead lines extends toward the display region.

The plurality of contact pads are arranged in at least two rows, and at least a part of the first insulation layer is located in the gap between the contact pads in different rows.

The at least two rows include a first row and a second row located between the first row and the display region, and parts, which are located in the second row, of the plurality of lead lines connected with the contact pads in the first row are located in gaps between the contact pads in the second row and are covered by the first insulation layer.

For the lead line and the contact pad, which are electrically connected with each other, an end part, which is electrically connected with the contact pad, of the lead line overlaps with the contact pad and is located between the contact pad and the base substrate.

The lead lines connected with the contact pads located in the first row include a first group of data lead lines and a second group of data lead lines, which are adjacent to each other, and the first group of data lead lines and the second group of data lead lines are located in different layers relative to the base substrate.

The display substrate further includes a second insulation layer located between the plurality of contact pads and the plurality of lead lines, a via is provided in the second insulation layer, and the lead line is connected with the corresponding contact pad through the via.

The display substrate further comprises a thin film transistor, a light-emitting element, and an interlayer dielectric layer, which are in the sub-pixel of the display region, one of a source electrode and a drain electrode of the thin film transistor is electrically connected with the light-emitting element; the interlayer dielectric layer is located between the active layer and a source-drain electrode layer of the thin film transistor, and the second insulation layer and the interlayer dielectric layer are arranged in the same layer.

The display substrate further includes a thin film transistor, a light-emitting element, and a planarization layer covering the thin film transistor, which are in the sub-pixel of the display region, one of the source electrode and the drain electrode of the thin film transistor is electrically connected with the light-emitting element; the first insulation layer and the planarization layer are arranged in the same layer.

A display device includes the display substrate as described above.

A manufacturing method for a display substrate includes: providing a base substrate, where the base substrate includes a display region and a bonding region located on at least one side of the display region; forming a plurality of contact pads spaced apart from each other in the bonding region; forming a first insulation layer in gaps between the plurality of contact pads, where the first insulation layer is formed to expose surfaces of the contact pads away from the base substrate.

The first insulation layer is formed such that a surface of the first insulation layer away from the base substrate is higher than a surface of the contact pad away from the base substrate, or the surface of the first insulation layer away from the base substrate and the surface of the contact pad away from the base substrate are in the same plane.

The forming the first insulation layer in gaps between the plurality of contact pads includes: after forming the plurality of contact pads, depositing a first material layer on the base substrate to planarize the surface of the display substrate; performing a patterning process on the first material layer to make the part of the first material layer located in the display region be formed as a planarization layer, removing the part of the first material layer overlapping with the plurality of contact pads, and thinning the part of the first material layer located in the bonding region and the gaps between the plurality of contact pads to form the first insulation layer.

The performing the patterning process on the first material layer includes: coating a photoresist on the first material layer; providing a first mask plate to expose and develop the photoresist so as to remove the part of the photoresist overlapping with the plurality of contact pads; performing a patterning process on the first material layer with the remaining photoresist as a mask to remove the part of the first material layer overlapping with the plurality of contact pads; removing the remaining photoresist in the bonding region; and in the bonding region, etching the part of the surface of the first material layer away from the base substrate and located in the gaps between the plurality of contact pads, and forming the first insulation layer by the remaining first material layer.

The performing the patterning process on the first material layer includes: coating a photoresist on the first material layer; exposing the photoresist using a gray tone mask plate or a halftone mask plate, and developing the exposed photoresist to remove the part of the photoresist overlapping with the plurality of contact pads and to thin the part of the photoresist overlapping the gaps between the plurality of contact pads; and in the bonding region, etching the first material layer to remove the part of the first material layer overlapping with the plurality of contact pads, performing an ashing process to remove the part of the photoresist overlapping with the gaps between the plurality of contact pads, and removing the part thickness of the part, which is away from the base substrate and overlaps with the gaps between the plurality of contact pads, of the first material layer.

The first material layer includes a photosensitive resin material, and the performing the patterning process on the first material layer includes: exposing the first material layer using a gray tone mask or a halftone mask, developing the exposed photoresist so that the part of the first material layer located in the display region is formed as the planarization layer, removing the part of the first material layer overlapping with the plurality of contact pads, and thinning the part, which is located in the bonding region and in the gaps between the plurality of contact pads, of the first material layer to form the first insulation layer.

Forming the plurality of contact pads includes: depositing a first conductive material thin film on the base substrate and performing a patterning process on the first conductive material thin film, where a part of the first conductive material thin film located in the display region is formed as a first conductive layer, and a part of the first conductive material thin film located in the bonding region is formed as the plurality of contact pads.

The manufacturing method further includes: before depositing the first conductive material thin film, forming the plurality of lead lines on a part of the bonding region, where first end parts of the plurality of lead lines extend to the display region, and after forming the plurality of contact pads, second end parts of the plurality of lead lines overlap and are connected with the plurality of contact pads.

Forming the plurality of lead lines on a part of the bonding region includes: respectively forming the first group of data lead lines and the second group of data lead lines in different layers relative to the base substrate in the bonding region.

The manufacturing method further includes: after forming the plurality of lead lines and before depositing the first conductive material thin film, depositing an insulation material thin film on the base substrate to cover the second conductive layer and the plurality of lead lines; in the bonding region, performing a patterning process on the insulation material thin film to form vias exposing the second end parts of the plurality of lead lines; after depositing the first conductive material thin film, the first conductive material thin film is connected with the plurality of lead lines through the vias; the part of the insulation material thin film located in the display region is an interlayer dielectric layer, and the part of the insulation material thin film located in the bonding region is a second insulation layer.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness a layer or region may be enlarged or narrowed, that is, the drawings are not drawn in a real scale.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A display substrate, comprising:
   a base substrate, comprising a display region and a bonding region on at least one side of the display region;
   a plurality of sub-pixels, in the display region;
   a plurality of data lines, in the display region and configured to provide data signals to the plurality of sub-pixels;
   a plurality of data lead lines, in the bonding region and electrically connected with the plurality of data lines, respectively;
   at least one group of contact pads, in the bonding region, wherein the at least one group of contact pads comprises a first group of contact pads and a second group of contact pads, each of the first group of contact pads and the second group of contact pads comprises a plurality of contact pads, the second group of contact pads is on a side of the first group of contact pads away from the display region, and the plurality of data lead lines are electrically connected with the first group of contact pads and the second group of contact pads; and a first insulation layer, in the bonding region, wherein the first insulation layer is in gaps between the plurality of contact pads and covers edges of the plurality of contact pads, and is configured to expose surfaces, away from the base substrate, of the plurality of contact pads;

wherein a plurality of contact pads of the first group of contact pads are arranged in at least a first row, and a plurality of contact pads of the second group of contact pads are arranged in at least a second row, a row direction of the first row and a row direction of the second row are parallel to an extending direction of a side edge, facing the bonding region, of the display region, at least a part of the first insulation layer is in a gap between the first row and the second row, and the first insulation layer include an organic insulation material or a combination of an organic insulation material and an inorganic insulation material.

2. The display substrate according to claim 1, wherein a vertical distance between a surface, away from the base substrate, of the first insulation layer and the base substrate is not less than a vertical distance between the surfaces, away from the base substrate, of the plurality of contact pads and the base substrate.

3. The display substrate according to claim 1, wherein at least a part of the first insulation layer is in a gap between adjacent contact pads of the first group of contact pads.

4. The display substrate according to claim 1, wherein at least a part of the first insulation layer is in a gap between adjacent contact pads of the second group of contact pads.

5. The display substrate according to claim 1, wherein each of a plurality of openings in the first insulation layer has a side wall, and the side wall of at least one of the plurality of openings has a slope angle relative to the base substrate, and a value range of the slope angle is from 40 degrees to 60 degrees.

6. The display substrate according to claim 1, wherein at least one of the plurality of contact pads has a length ranging from 650 microns to 750 microns and a width ranging from 34 microns to 42 microns.

7. The display substrate according to claim 1, wherein at least one of the plurality of sub-pixels comprises a thin film transistor, a planarization layer, and a light-emitting element, the planarization layer is on a side of the thin film transistor away from the base substrate to cover the thin film transistor, the light-emitting element is on a side of the planarization layer away from the base substrate, the planarization layer comprises a first planarization layer via, the thin film transistor comprises an active layer on the base substrate, a gate electrode on a side of the active layer away from the base substrate, and a source electrode and a drain electrode on a side of the gate electrode away from the base substrate, and one of the source electrode and the drain electrode is electrically connected with the light-emitting element through the first planarization layer via; and the first insulation layer and the planarization layer are arranged in a same layer.

8. The display substrate according to claim 7, wherein relative to the base substrate, a thickness of the first insulation layer in the bonding region is smaller than a thickness of the planarization layer in the display region.

9. The display substrate according to claim 7, wherein the plurality of data lead lines comprise a first group of data lead lines and a second group of data lead lines, data lead lines of the first group of data lead lines is are electrically connected with contact pads of the first group of contact pads in one-to-one correspondence manner, data lead lines of the second group of data lead lines is are electrically connected with contact pads of the second group of contact pads in one-to-one correspondence manner, and relative to the base substrate, the first group of data lead lines and the second group of data lead lines are in different layers, respectively.

10. The display substrate according to claim 9, wherein the at least one of the plurality of sub-pixels further comprises a storage capacitor, and the storage capacitor comprises two capacitor electrodes, and the first group of data lead lines and the gate electrode are arranged in a same layer, and the second group of data lead lines and one of the two capacitor electrodes of the storage capacitor are arranged in a same layer; or the second group of data lead lines and the gate electrode are arranged in a same layer, and the first group of data lead lines and one of the two capacitor electrodes of the storage capacitor are arranged in a same layer.

11. The display substrate according to claim 9, further comprising:

a bonding region interlayer insulation layer, in the bonding region, and between the plurality of contact pads and the plurality of data lead lines and between the first insulation layer and the base substrate;

a bonding region first gate insulation layer, in the bonding region, and at a side of the bonding region interlayer insulation layer close to the base substrate; and a bonding region second gate insulation layer, in the bonding region, and between the bonding region first gate insulation layer and the bonding region interlayer insulation layer, and laminated with the bonding region interlayer insulation layer, wherein the contact pads of the first group of contact pads are electrically connected with the data lead lines of the first group of data lead lines in one-to-one correspondence manner through a plurality of first contact pad vias passing through the bonding region interlayer insulation layer, and the contact pads of the second group of contact pads are electrically connected with the data lead lines of the second group of data lead lines in one-to-one correspondence manner through a plurality of second contact pad vias passing through the bonding region interlayer insulation layer and the bonding region second gate insulation layer; or the contact pads of the second group of contact pads are electrically connected with the data lead lines of the second group of data lead lines in one-to-one correspondence manner through a plurality of second contact pad vias passing through the bonding region interlayer insulation layer, and the contact pads of the first group of contact is electrically connected with the data lead lines of the first group of data lead lines in one-to-one correspondence manner through a plurality of first contact pad vias passing through the bonding region interlayer insulation layer and the bonding region second gate insulation layer.

12. The display substrate according to claim 1, wherein at least one data lead line in the first group of data lead lines extends obliquely relative to an edge of the display substrate, or at least one data lead line in the second group of data lead lines extends obliquely relative to the edge of the display substrate.

13. The display substrate according claim 12, wherein at least two data lead lines in the first group of data lead lines extend obliquely relative to the edge of the display substrate, and included angles of the at least two data lead lines in the first group of data lead lines relative to the edge of the display substrate in a same rotation direction are identical or complementary.

14. The display substrate according claim 12, wherein at least two data lead lines in the second group of data lead lines extend obliquely relative to the edge of the display substrate, and included angles of the at least two data lead lines in the second group of data lead lines relative to the edge of the display substrate in a same rotation direction are identical or complementary.

15. The display substrate according to claim 1, wherein at least one contact pad of the first group of contact pads extends obliquely relative to an edge of the display substrate, or
at least one contact pad of the second group of contact pads extends obliquely relative to the edge of the display substrate.

16. The display substrate according claim 15, wherein at least two contact pads of the first group of contact pads extend obliquely relative to the edge of the display substrate, and included angles of the at least two contact pads of the first group of contact pads relative to the edge of the display substrate in a same rotation direction are identical or complementary.

17. The display substrate according claim 15, wherein at least two contact pads of the second group of contact pads extend obliquely relative to the edge of the display substrate, and included angles of the at least two contact pads of the second group of contact pads relative to the edge of the display substrate in a same rotation direction are identical or complementary.

18. A display device, comprising: a display substrate, wherein the display substrate comprises:
a base substrate, comprising a display region and a bonding region on at least one side of the display region;
a plurality of sub-pixels, in the display region;
a plurality of data lines, in the display region and configured to provide data signals to the plurality of sub-pixels;
a plurality of data lead lines, in the bonding region and electrically connected with the plurality of data lines, respectively;
at least one group of contact pads, in the bonding region, wherein the at least one group of contact pads comprises a first group of contact pads and a second group of contact pads, each of the first group of contact pads and the second group of contact pads comprises a plurality of contact pads, the second group of contact pads is on a side of the first group of contact pads away from the display region, and the plurality of data lead lines are electrically connected with the first group of contact pads and the second group of contact pads; and
a first insulation layer, in the bonding region, wherein the first insulation layer is in gaps between the plurality of contact pads and covers edges of the plurality of contact pads, and is configured to expose surfaces, away from the base substrate, of the plurality of contact pads;
wherein a plurality of contact pads of the first group of contact pads are arranged in at least a first row, and a plurality of contact pads of the second group of contact pads are arranged in at least a second row,
a row direction of the first row and a row direction of the second row are parallel to an extending direction of a side edge, facing the bonding region, of the display region,
at least a part of the first insulation layer is in a gap between the first row and the second row, and
the first insulation layer include an organic insulation material or a combination of an organic insulation material and an inorganic insulation material.

19. A manufacturing method for a display substrate, comprising:
providing a base substrate, wherein the base substrate comprises a display region and a bonding region on at least one side of the display region;
forming a plurality of sub-pixels and a plurality of data lines in the display region, wherein the plurality of data lines are configured to provide data signals to the plurality of sub-pixels;
forming a plurality of data lead lines in the bonding region;
forming at least one group of contact pads in the bonding region, wherein the at least one group of contact pads comprises a first group of contact pads and a second group of contact pads, each of the first group of contact pads and the second group of contact pads comprises a plurality of contact pads, the second group of contact pads is on a side of the first group of contact pads away from the display region, and the plurality of data lead lines are electrically connected with the first group of contact pads and the second group of contact pads in one-to-one correspondence manner; and
forming a first insulation layer in the bonding region, wherein the first insulation layer is in gaps between the plurality of contact pads and covers edges of the plurality of contact pads, and is configured to expose surfaces, away from the base substrate, of the plurality of contact pads;
wherein a plurality of contact pads of the first group of contact pads are arranged in at least a first row, and a plurality of contact pads of the second group of contact pads are arranged in at least a second row,
a row direction of the first row and a row direction of the second row are parallel to an extending direction of a side edge, facing the bonding region, of the display region,
at least a part of the first insulation layer is in a gap between the first row and the second row, and
the first insulation layer include an organic insulation material or a combination of an organic insulation material and an inorganic insulation material.

* * * * *